(12) United States Patent
Asano et al.

(10) Patent No.: US 12,414,429 B2
(45) Date of Patent: Sep. 9, 2025

(54) METAL OXIDE PARTICLES HAVING P-TYPE SEMICONDUCTIVITY, ELECTRONIC DEVICE USING THE SAME, METHOD FOR MANUFACTURING ELECTRONIC DEVICE, AND IMAGE FORMING APPARATUS

(71) Applicants: Tomoharu Asano, Hyogo (JP); Hidetoshi Kami, Shizuoka (JP); Ryota Inoue, Shizuoka (JP)

(72) Inventors: Tomoharu Asano, Hyogo (JP); Hidetoshi Kami, Shizuoka (JP); Ryota Inoue, Shizuoka (JP)

(73) Assignee: Ricoh Company, Ltd.

( * ) Notice: Subject to any disclaimer, the term of this patent is extended or adjusted under 35 U.S.C. 154(b) by 470 days.

(21) Appl. No.: 17/906,259

(22) PCT Filed: Mar. 25, 2021

(86) PCT No.: PCT/IB2021/052469
§ 371 (c)(1),
(2) Date: Sep. 13, 2022

(87) PCT Pub. No.: WO2021/234469
PCT Pub. Date: Nov. 25, 2021

(65) Prior Publication Data
US 2023/0125171 A1    Apr. 27, 2023

(30) Foreign Application Priority Data
May 19, 2020 (JP) .................................. 2020-087650

(51) Int. Cl.
*H10K 50/15* (2023.01)
*H10K 30/50* (2023.01)
(Continued)

(52) U.S. Cl.
CPC ............. *H10K 50/15* (2023.02); *H10K 30/50* (2023.02); *H10K 50/11* (2023.02); *H10K 71/60* (2023.02); *H10K 77/10* (2023.02); *H10K 85/371* (2023.02)

(58) Field of Classification Search
None
See application file for complete search history.

(56) References Cited

U.S. PATENT DOCUMENTS

| 2015/0076420 A1 | 3/2015 | Kaneko et al. |
| 2016/0218308 A1 | 7/2016 | Desilvestro et al. |
| 2021/0003931 A1 | 1/2021 | Kubo et al. |

FOREIGN PATENT DOCUMENTS

| CN | 102326260 A | 1/2012 |
| CN | 102792516 A | 11/2012 |

(Continued)

OTHER PUBLICATIONS

Japanese Office Action dated Feb. 2, 2024, in Japanese Application No. 2020-087650, 2 pages.

(Continued)

*Primary Examiner* — Anthony Ho
(74) *Attorney, Agent, or Firm* — Grüneberg and Myers PLLC

(57) ABSTRACT

Metal oxide particles have p-type semiconductivity. The metal oxide particles have a volume-based particle size distribution having a first local maximum value and a second local maximum value. The first local maximum value is in a range of 0.1 μm or more and less than 5 μm, and the second local maximum value is in a range of 5 μm or more and less than 50 μm. A ratio of the second local maximum value to the first local maximum value is 0.5 or more and less than 2.0. 99% by volume or more of the metal oxide particles have a particle diameter in a range of from 0.1 to 50 μm.

5 Claims, 10 Drawing Sheets

(51) Int. Cl.
  *H10K 50/11* (2023.01)
  *H10K 71/60* (2023.01)
  *H10K 77/10* (2023.01)
  *H10K 85/30* (2023.01)

(56) References Cited

FOREIGN PATENT DOCUMENTS

| | | |
|---|---|---|
| CN | 105556681 A | 5/2016 |
| CN | 105594006 A | 5/2016 |
| EP | 3 508 514 A1 | 7/2019 |
| JP | H11-269506 | 10/1999 |
| JP | 2000-150166 | 5/2000 |
| JP | 2005-330555 | 12/2005 |
| JP | 2005-336573 A | 12/2005 |
| JP | 2007-254826 | 10/2007 |
| JP | 2007-270899 | 10/2007 |
| JP | 2008-050658 | 3/2008 |
| JP | 2008-111154 | 5/2008 |
| JP | 2008-145737 | 6/2008 |
| JP | 2008-196011 | 8/2008 |
| JP | 2008-201004 | 9/2008 |
| JP | 2012-069806 | 4/2012 |
| JP | 2013-130603 | 7/2013 |
| JP | 2016-095339 | 5/2016 |
| JP | 2017-179421 | 10/2017 |
| WO | WO2016/117598 A1 | 7/2016 |
| WO | WO2018/194064 A1 | 10/2018 |

OTHER PUBLICATIONS

Ahmed et al., "Scalable synthesis of delafossite $CuAlO_2$ nanoparticles for p-type dye-sensitized solar cells applications", Journal of Alloys and Compounds, vol. 591, Jan. 3, 2014, pp. 275-279.

Office Action received for European Patent Application No. 21718194.0, issued on Aug. 9, 2024, 5 pages.

International Search Report issued on May 28, 2021 in PCT/IB2021/052469 filed on Mar. 25, 2021.

Office Action received for Chinese Patent Application No. 202180033715.5, mailed on May 20, 2025, 14 pages with English translation.

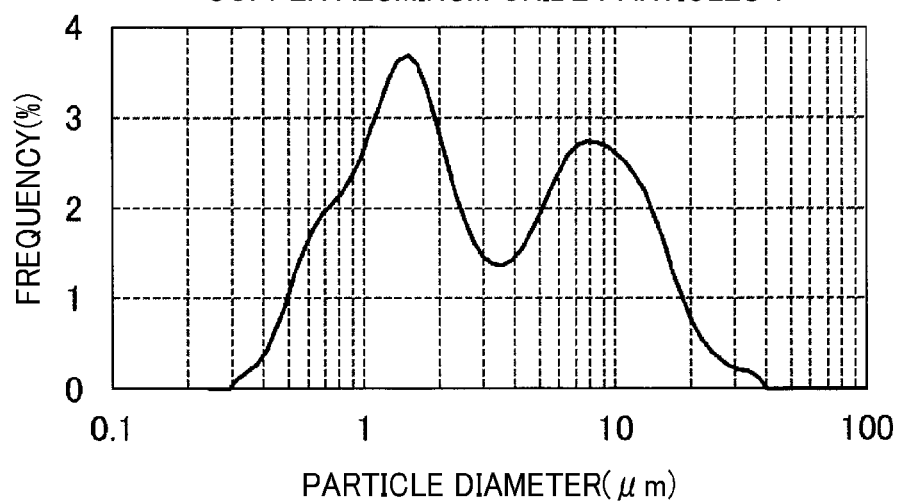

METAL OXIDE PARTICLES HAVING P-TYPE SEMICONDUCTIVITY, ELECTRONIC DEVICE USING THE SAME, METHOD FOR MANUFACTURING ELECTRONIC DEVICE, AND IMAGE FORMING APPARATUS

CROSS-REFERENCE TO RELATED APPLICATIONS

This application is the National Stage entry under § 371 of International Application No. PCT/IB2021/052469, filed on Mar. 25, 2021, and which claims the benefit of priority to Japanese Application No. 2020-087650, filed on May 19, 2020. The content of each of these applications is hereby incorporated by reference in its entirety.

BACKGROUND OF THE INVENTION

Technical Field

The present disclosure relates to metal oxide particles having p-type semiconductivity, an electronic device using the same, a method for manufacturing an electronic device, and an image forming apparatus.

Background Art

In recent years, photoelectric conversion devices including semiconductors made of organic materials have been developed and put on the market.

Currently, most of widely-used photoelectric conversion devices such as electrophotographic photoconductors are organic electronic devices made of organic materials. However, organic electronic devices have a drawback that their lifespan is shorter than that of inorganic electronic devices. One of the causes is that a gas barrier property derived from the organic materials contained in the organic electronic devices is poor. Resin films of organic materials have more void spaces than dense films of inorganic materials. For this reason, food packaging materials such as polypropylene (PP) are laminated with aluminum to improve weather resistance of their contents.

Dye-sensitized solar cells containing organic sensitizing dyes have been developed as organic solar cells which are lower in cost compared to silicon-based solar cells.

However, since the dye-sensitized solar cells contain organic sensitizing dyes, which are organic materials, the materials used tend to deteriorate by temperature, humidity, gas such as oxygen, ozone, $NO_x$, and ammonia and degrade their functions. The dye-sensitized solar cells have a drawback that their durability is inferior to that of silicon-based solar cells.

In display devices such as organic electroluminescence (EL) devices, light emitting diode display devices, liquid crystal display devices, and electrophoretic ink display devices, display elements such as organic EL light emitting layers sandwiched between a cathode and an anode are laminated on a substrate. Organic EL display devices have a wider viewing angle and a faster response speed than liquid crystal display devices and are expected as next-generation display devices for the variety of luminescence of organic substances. As a method for forming these organic EL devices, coating methods have been used for their productivity and cost. Organic EL devices tend to deteriorate by exposure to heat, moisture, or gas such as oxygen gas, which disadvantageously results in a short lifespan of the organic EL devices.

To extend the lifespan of organic electronic devices, such as electrophotographic photoconductors for printers, dye-sensitized solar cells, and organic EL devices, various attempts have been made to improve the gas barrier property. However, since their manufacturing processes are large in number and accompanied by adverse effects, there is room for further improvement in the balance between cost and durability.

In attempting to provide an electrophotographic photoconductor having excellent wear resistance and stability in image properties, for example, an electrophotographic photoconductor having a protective layer containing p-type semiconductor particles treated with a surface treatment agent has been proposed (see, for example, Patent Literature 1). In attempting to provide an organic EL device having a long lifespan, improved efficiency, and a low operating voltage, for example, an organic EL device having an inorganic p-type semiconductor in place of an organic hole transport layer has been proposed (see, for example, Patent Literature 2).

Further, there has been proposed a laminate in which ultrafine particle materials having a size of 100 μm or less, such as ceramic materials and metal materials, are deposited on a substrate by an aerosol deposition method to form a polycrystalline brittle material layer (see, for example, Patent Literature 3).

Further, a method of controlling the particle size distribution of zirconia particles and forming a white zirconia film by an aerosol deposition method has been proposed (see, for example, Patent Literature 4).

Wear resistance and gas barrier property can be improved by providing a surface layer of a metal oxide having p-type semiconductivity. There has been a proposal to specify the viscoelasticity of the coated surface of a laminate in which a plastic substrate is ceramic-coated (see, for example, Patent Literature 5). However, simply coating a plastic substrate with ceramic is insufficient to achieve elaborate semiconductor characteristics.

CITATION LIST

Patent Literature

[PTL 1]
Japanese Patent No. 5664538
[PTL 2]
Japanese Unexamined Patent Application Publication No. 2000-150166
[PTL 3]
Japanese Unexamined Patent Application Publication No. 2008-201004
[PTL 4]
Japanese Unexamined Patent Application Publication No. 2017-179421
[PTL 5]
WO2018/194064

SUMMARY OF INVENTION

Technical Problem

An object of the present invention is to provide metal oxide particles having p-type semiconductivity that exhibit high gas barrier property when formed into a metal oxide film.

Solution to Problem

In accordance with embodiments of the present invention, metal oxide particles having p-type semiconductivity are provided. The metal oxide particles have a volume-based particle size distribution having a first local maximum value and a second local maximum value. The first local maximum value is in a range of 0.1 µm or more and less than 5 µm and the second local maximum value is in a range of 5 µm or more and less than 50 µm. A ratio of the second local maximum value to the first local maximum value is 0.5 or more and less than 2.0, and 99% by volume or more of the metal oxide particles have a particle diameter in a range of from 0.1 to 50 µm.

Advantageous Effects of Invention

According to some embodiments of the present invention, provided are metal oxide particles having p-type semiconductivity that exhibit high gas barrier property when formed into a metal oxide film.

BRIEF DESCRIPTION OF DRAWINGS

The accompanying drawings are intended to depict example embodiments of the present invention and should not be interpreted to limit the scope thereof. The accompanying drawings are not to be considered as drawn to scale unless explicitly noted. Also, identical or similar reference numerals designate identical or similar components throughout the several views.

FIG. 10 is a particle size distribution diagram of metal oxide particles 1 having p-type semiconductivity according to an embodiment of the present invention shown in Examples.

DESCRIPTION OF EMBODIMENTS

Figure 1:
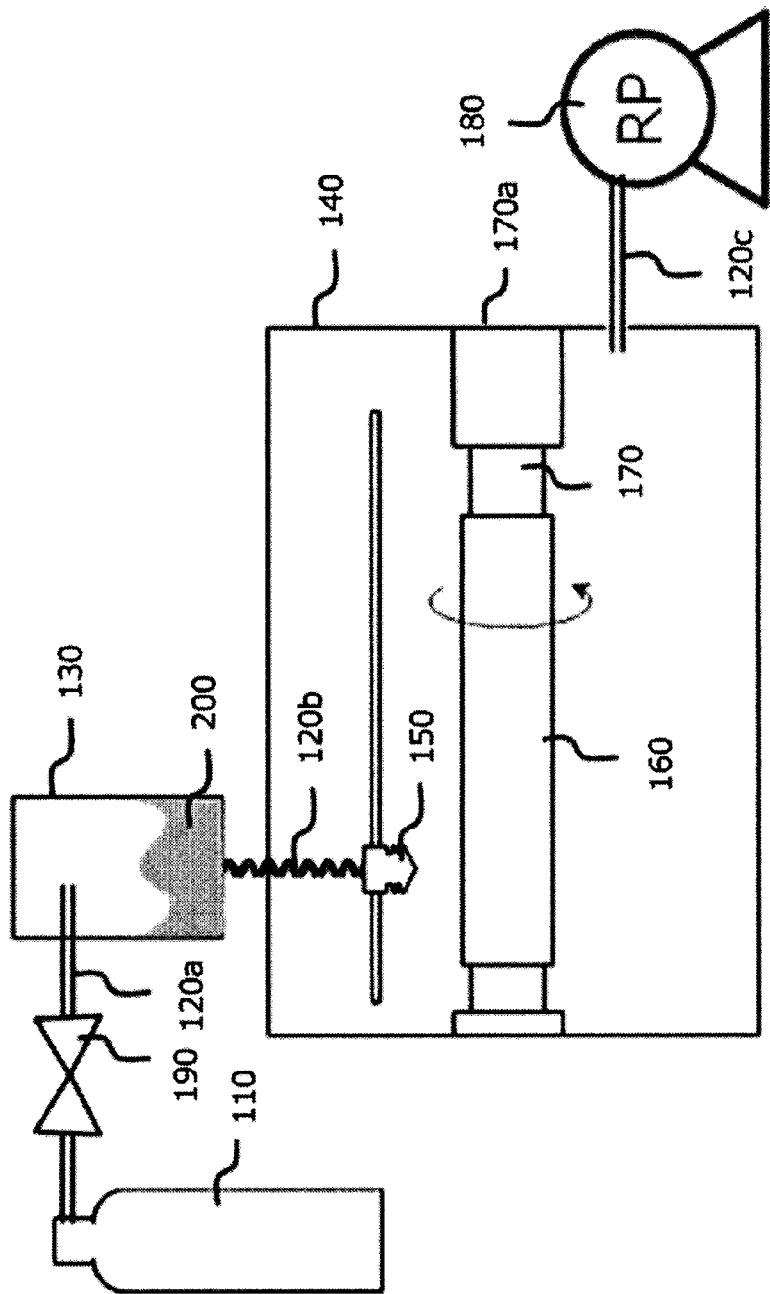
FIG. 1 is a schematic view of an aerosol deposition device used for forming the metal oxide film according to an embodiment of the present invention.

The terminology used herein is for the purpose of describing particular embodiments only and is not intended to be limiting of the present invention. As used herein, the singular forms "a," "an," and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Embodiments of the present invention are described in detail below with reference to the drawings.

Electronic Device

An electronic device (hereinafter may be simply referred to as "device") of the present disclosure includes: a substrate; a charge transport layer containing a charge transport material or a dye-sensitized electrode layer containing a sensitizing dye, overlying the substrate; and a metal oxide film overlying the charge transport layer or the dye-sensitized electrode layer. The metal oxide film contains a metal oxide having p-type semiconductivity. The electronic device may further include a silicone-containing layer and other members as necessary. The electronic device is not particularly limited and can be suitably selected to suit to a particular application. Specific examples thereof include, but are not limited to, electrophotographic photoconductors, solar cells, organic electroluminescence (EL) devices, transistors, integrated circuits, laser diodes, and light emitting diodes.

Silicone-Containing Layer

Preferably, the device of the present disclosure includes a silicone-containing layer between the charge transport layer or dye-sensitized electrode layer and the metal oxide film. The silicone-containing layer is not particularly limited and can be suitably selected to suit to a particular application as long as it contains a polysiloxane structure.

When the device includes the silicone-containing layer having a polysiloxane structure, a laminated structure made of an organic material film and a metal oxide film can be easily and inexpensively produced. The silicone-containing layer has effects of suppressing erosion of the base layer when forming a metal oxide layer and preventing peeling of the metal oxide layer.

The silicone-containing layer may be formed by cross-linking an organosilicon compound having either a hydroxyl group or a hydrolyzable group. The silicone-containing layer may contain, as necessary, a catalyst, a cross-linking agent, an organosilica sol, a silane-coupling agent, and/or a polymer such as acrylic polymer.

The cross-linking method is not particularly limited and can be suitably selected to suit to a particular application, but thermal cross-linking is preferred.

Examples of the organosilicon compound having either a hydroxyl group or a hydrolyzable group include, but are not limited to, compounds having an alkoxysilyl group, partially hydrolyzed condensates of compounds having an alkoxysilyl group, and mixtures thereof.

Specific examples of the compounds having an alkoxysilyl group include, but are not limited to, tetraalkoxysilane such as tetraethoxysilane, alkyltrialkoxysilane such as methyltriethoxysilane, and aryltrialkoxysilane such as phenyltriethoxysilane. In addition, these compounds to which epoxy group, methacryloyl group, or vinyl group is introduced can also be used.

The partially hydrolyzed condensates of compounds having an alkoxysilyl group can be produced by known methods such as a method of adding a predetermined amount of water, a catalyst, or the like to the compound having an alkoxysilyl group to cause the compound to react.

Raw materials of the silicone-containing layer may be commercially available products. Specific examples thereof include, but are not limited to, GR-COAT (product of Daicel Chemical Industries, Ltd.), GLASS RESIN (product of Owens Corning Corporation), heatless glass (product of Ohashi Chemical Industries, Ltd.), NSC (product of NIPPON FINE CHEMICAL CO., LTD.), glass stock solutions GO150SX and GO200CL (products of Fine Glass Technologies Co., Ltd.), MKC SILICATE (product of Mitsubishi Chemical Corporation) as a copolymer of acrylic resin or polyester resin with alkoxysilyl compound, silicate/acrylic varnish XP-1030-1 (product of Dainippon Shikizai Kogyo Co., Ltd.), and NSC-5506 (product of NIPPON FINE CHEMICAL CO., LTD.).

The silicone-containing layer may contain a monoalkoxysilane as a constituent component.

Monoalkoxysilane

When the silicone-containing layer contains a certain amount of monoalkoxysilane as a constituent component, the occurrence of cracks is prevented in the silicone-containing layer. Also, it is advantageous for the stability of device characteristics against changes in temperature and humidity.

Specific examples of the monoalkoxysilane include, but are not limited to, monoalkoxyalkylsilanes such as trimethylethoxysilane, trimethylmethoxysilane, tripropylethoxysilane, and trihexylethoxysilane. The number of carbon atoms in the alkoxy group may be from 1 to 3. The number of carbon atoms in the alkyl group may be from 1 to 6. In particular, trimethylethoxysilane is effective.

The silicone-containing layer may contain at least one of a triphenylamine compound having a hydroxyl group, polymethylphenylsilane, and a delafossite-type oxide as a constituent component.

Triphenylamine Compound Having Hydroxyl Group

The triphenylamine compound having a hydroxyl group is not particularly limited and can be suitably selected to suit to a particular application as long as it is a compound having a hydroxyl group, a nitrogen atom, and three aromatic groups bonded to the nitrogen atom. Preferred examples of the triphenylamine compound having a hydroxyl group include the following compounds represented by general formula (1), general formula (2), structural formula (3), or general formula (4), most of which have excellent reactivity with thermosetting resin monomers and show good performance in terms of sensitivity characteristics.

[Chem. 1]

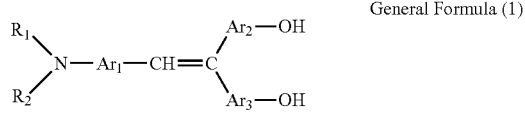

General Formula (1)

(In the formula, each of $R_1$ and $R_2$ independently represents a substituted or unsubstituted aryl group; and each of $Ar_1$, $Ar_2$ and $Ar_3$ independently represents an arylene group, which may be a divalent group of the same aryl group as $R_1$ and $R_2$.)

Each of $R_1$ and $R_2$ independently represents a substituted or unsubstituted aryl group. Specific examples thereof include, but are not limited to, the following groups:
aromatic hydrocarbon groups including: phenyl group; condensed polycyclic groups such as naphthyl group, pyrenyl group, 2-fluorenyl group, 9,9-dimethyl-2-fluorenyl group, azulenyl group, anthryl group, triphenylenyl group, chrysenyl group, fluorenylidene phenyl group, and 5H-dibenzo[a,d]cycloheptenylidene phenyl group; and non-condensed polycyclic groups such as biphenylyl group, terphenylyl group, and a group represented by the following formula:

[Chem. 2]

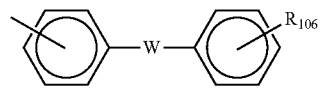

(In the formula, W represents —O—, —S—, —SO—, —SO$_2$—, —CO— or the following divalent groups. $R_{106}$ will be described later.)

[Chem. 3]

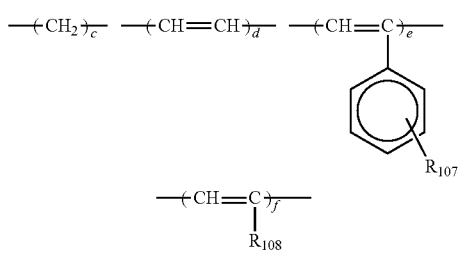

(In the formulas, c represents an integer of from 1 to 12, d represents an integer of from 1 to 3, e represents an integer of from 1 to 3, and f represents an integer of from 1 to 3. $R_{107}$ and $R_{108}$ will be described later.)

Examples of heterocyclic groups include, but are not limited to, thienyl group, benzothienyl group, furyl group, a benzofuranyl group, and carbazolyl group.

The above-described aryl group and arylene group may have a substituent represented by the following groups (1) to (7).

These substituents are represented as specific examples of $R_{106}$, $R_{107}$, and $R_{108}$ in the above general formulae.

(1) Halogen atom, trifluoromethyl group, cyano group, and nitro group.

(2) Alkyl groups, preferably, straight-chain or branched alkyl groups containing 1 to 12, particularly 1 to 8, and more particularly 1 to 4, carbon atoms, which may further contain fluorine atom, hydroxyl group, cyano group, C1-C4 alkoxy group, phenyl group, or phenyl group substituted with halogen atom, C1-C4 alkyl group, or C1-C4 alkoxy group. Specifically, methyl group, ethyl group, n-propyl group, i-propyl group, t-butyl group, s-butyl group, n-butyl group, i-butyl group, trifluoromethyl group, 2-hydroxyethyl group, 2-cyanoethyl group, 2-ethoxyethyl group, 2-methoxyethyl group, benzyl group, 4-chlorobenzyl group, 4-methylbenzyl group, 4-methoxybenzyl group, and 4-phenylbenzyl group.

(3) Alkoxy groups, such as methoxy group, ethoxy group, n-propoxy group, i-propoxy group, t-butoxy group, n-butoxy group, s-butoxy group, i-butoxy group, 2-hydroxyethoxy group, 2-cyanoethoxy group, benzyloxy group, 4-methylbenzyloxy group, and trifluoromethoxy group.

(4) Aryloxy groups, derived from aryl groups such as phenyl group and naphthyl group, which may contain C1-C4 alkoxy group, C1-C4 alkyl group, or halogen atom as a substituent. Specifically, phenoxy group, 1-naphthyloxy group, 2-naphthyloxy group, 4-methylphenoxy group, 4-methoxyphenoxy group, 4-chlorophenoxy group, and 6-methyl-2-naphthyloxy group.

(5) Substituted mercapto groups and aryl mercapto groups, such as methylthio group, ethylthio group, phenylthio group, and p-methylphenylthio group.

(6) Groups represented by the following general formula.

[Chem. 4]

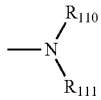

(In the formula, each of $R_{110}$ and $R_{111}$ independently represents an alkyl group or an aryl group. Examples of the aryl group include phenyl group, biphenyl group, and naphthyl group, all of which may contain C1-C4 alkoxy group, C1-C4 alkyl group, or halogen atom as a substituent or as a group that shares bond connectivity with carbon atoms in the aryl group to forma ring.) Specifically, diethylamino group, N-methyl-N-phenylamino group, N,N-diphenylamino group, N,N-di(p-tolyl)amino group, dibenzylamino group, piperidino group, morpholino group, and julolidyl group.

(7) Alkylenedioxy groups and alkylenedithio groups, such as methylenedioxy group and methylenedithio group.

The compounds represented by the general formula (1) are useful as being soluble in solvents such as alcohols and cellosolves and as can be easily formed into a clear and uniform film using these solvents.

[Chem. 5]

General Formula (2)

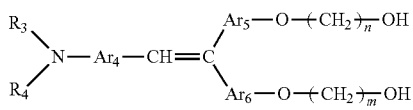

(In the formula, each of $R_3$ and $R_4$ independently represents a substituted or unsubstituted aryl group; each of $Ar_4$, $Ar_5$, and $Ar_6$ independently represents an arylene group, which may be a divalent group of the same aryl group as $R_3$ and $R_4$; and each of m and n independently represents a repeating number of from 1 to 10.)

$R_3$ and $R_4$ represent the same substituents as $R_1$ and $R_2$ in the general formula (1), respectively. Further, $Ar_4$, $Ar_5$ and $Ar_6$ also represent the same substituents as $Ar_1$, $Ar_2$ and $Ar_3$ in the general formula (1), respectively.

[Chem. 6]

Structural Formula

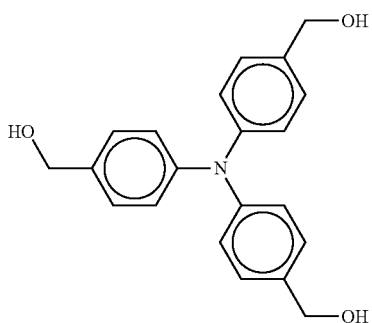

[Chem. 7]

General Formula (4)

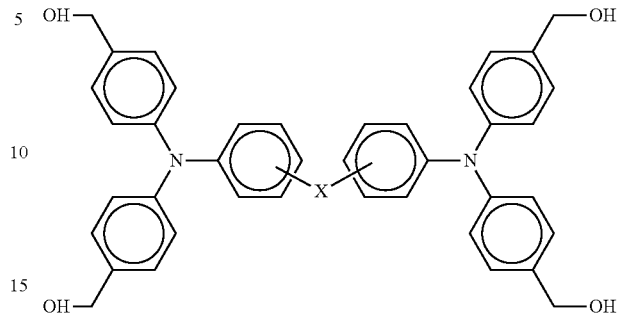

(In the formula, X represents —$CH_2$—, —O—, —CH=CH—, or —$CH_2CH_2$—.)

Polymethylphenylsilane

The polymethylphenylsilane is not particularly limited and can be suitably selected to suit to a particular application.

The polymethylphenylsilane may be a commercially available product. Examples of commercially available products include, but are not limited to, OGSOL SI-10-10 (polymethylphenylsilane having a number average molecular weight Mn of 2,100 and a weight average molecular weight Mw of 12,700), product of Osaka Gas Chemicals Co., Ltd.; and OGSOL SI-10-20 (polymethylphenylsilane having a number average molecular weight Mn of 1,100 and a weight average molecular weight Mw of 1,800), product of Osaka Gas Chemicals Co., Ltd.

Delafossite-Type Oxide

Examples of the delafossite-type oxide include delafossite-type oxides described later in the description of the metal oxide film.

The average thickness of the silicone-containing layer is preferably from 0.1 to 4.0 μm, and more preferably from 0.3 to 1.5 μm.

The average thickness can be determined by a measurement using an eddy current film thickness meter or an observation of a photograph of a cross-section using a scanning electron microscope. The average thickness is an arithmetic mean value of measurement results at 20 points.

An example method for determining the average thickness of the silicone-containing layer in the present disclosure is described below. First, a film thickness of a film-formed body, on which the silicone-containing layer is to be formed, is measured using an eddy current film thickness meter (FISHERSCOPE MMS, product of Fischer Instruments K.K.) at 20 points of equal intervals in the longitudinal direction. Next, the film thickness is measured at the same points after the silicone-containing layer has been formed. An initial film thickness of the silicone-containing layer is determined from the difference between the film thicknesses measured before and after the formation of the silicone-containing layer.

Next, a metal oxide film is formed on the silicone-containing layer, and a part of the film-formed product is cut off. A cross-section of the cut-off sample is smoothed by ion milling or focused ion beam processing to prepare a sample for cross-section observation. The sample is observed with a scanning electron microscope, and the thickness of the silicone-containing layer is measured. There is a case in which an apparent film thickness of the silicone-containing layer on which the metal oxide film is formed is smaller than the average film thickness determined by the eddy current film thickness meter due to the occurrence of slight erosion or embedment (anchoring) of the metal oxide. For this reason, image analysis of a photograph of a cross-section can be performed.

In a case in which the metal oxide film is embedded in the silicone-containing layer, the thickness is measured at 10 peak points and 10 valley points on the interface. The average of the measurement results at 20 points in total is taken as the average thickness. It is desirable to cut off a part of the film-formed product at several positions and observe all the cut-off samples in the same manner.

A method for preparing the silicone-containing layer is not particularly limited and can be suitably selected to suit to a particular application. Specific examples thereof include, but are not limited to, a method of applying a silicone-containing layer coating liquid onto the charge transport layer or dye-sensitized electrode layer, followed by heating.

The applying method is not particularly limited and can be suitably selected to suit to a particular application. Examples thereof include, but are not limited to, dipping, spray coating, ring coating, roll coating, gravure coating, nozzle coating, and screen printing.

The heating temperature and time are not particularly limited and can be suitably selected to suit to a particular application.

The silicone-containing layer coating liquid may contain an organosilicon compound having either a hydroxyl group or a hydrolyzable group, preferably at least one of a triphenylamine compound having a hydroxyl group, polymethylphenylsilane, and a delafossite-type oxide, and may further contain other constituents such as a solvent as necessary.

Metal Oxide Film

The metal oxide film is not particularly limited and can be suitably selected to suit to a particular application as long as it has p-type semiconductivity. Preferably, the metal oxide film comprises a delafossite-type oxide.

An electronic device having a metal oxide film containing the metal oxide particles according to an embodiment of the present invention has been achieved based on the finding that not all conventional electronic devices have a metal oxide film having high density.

In forming a film of metal oxide particles having p-type semiconductivity by a conventional aerosol deposition method, there is room for improvement in adhesion between the film and the substrate surface and in film density, because the particle size distribution of the metal oxide particles having p-type semiconductivity has not been optimized.

In the present disclosure, a metal oxide film containing a metal oxide having p-type semiconductivity is formed on the charge transport layer or dye-sensitized electrode layer using metal oxide particles having p-type semiconductivity and a suitable particle size distribution. As a result, the adhesion between the substrate surface and the metal oxide film is sufficient and the metal oxide film is densified, providing an electronic device that has high gas barrier property and is capable of performing fine photoelectric conversion.

Delafossite-Type Oxide

The delafossite-type oxide (hereinafter may be referred to as "p-type semiconductor" or "p-type metal compound semiconductor") is not particularly limited and can be suitably selected to suit to a particular application as long as it has a function as a p-type semiconductor. Examples thereof include, but are not limited to, p-type metal oxide semiconductors, p-type compound semiconductors containing monovalent copper, and other p-type metal compound semiconductors.

Specific examples of the p-type metal oxide semiconductors include, but are not limited to, $CoO$, $NiO$, $FeO$, $Bi_2O_3$, $MoO_2$, $Cr_2O_3$, $SrCu_2O_2$, and $CaO$—$Al_2O_3$.

Specific examples of the p-type compound semiconductors containing monovalent copper include, but are not limited to, $Cu_2O$, $CuAlO$, $CuAlO_2$, and $CuGaO_2$.

Among these, copper aluminum oxides such as $CuAlO$ and $CuAlO_2$ are preferred for charge mobility and translucency.

Film Thickness of Metal Oxide Film

Preferably, the average thickness of the metal oxide film is from 0.3 to 5 μm. More preferably, the average thickness of the metal oxide film is from 0.3 to 5 μm, and the standard deviation of the film thickness is 0.07 μm or less.

When the average thickness of the metal oxide film is from 0.3 to 5 μm, the balance between wear resistance and electrostatic characteristics is excellent and the lifespan is long, which is advantageous for producing high-quality printed images. When the standard deviation of the film thickness of the metal oxide film is 0.07 μm or less, it is advantageous for producing printed images having excellent gradation reproducibility, which affects the impression of appearance of human skin and scenery in the printed images.

In an electrophotographic photoconductor as one embodiment of the device of the present disclosure, the film thickness is measured as follows. In the case of a cylindrical photoconductor drum having a length of 380 mm and an outer diameter of 100 mm, first, the film thickness is measured at 5 points on the photoconductor drum between positions 100 mm and 300 mm respectively away from an end of the drum at intervals of 50 mm in the longitudinal direction. The film thickness is determined by image analysis of a SEM image of a cross-section. Specifically, after cutting the drum with a saw, a cross-section of the cut sample is created by ion milling, and a SEM image of the cross-section is obtained. The film thickness is measured by analysis of the SEM image.

Method for Manufacturing Electronic Device

A method for manufacturing an electronic device according to an embodiment of the present invention is a method for manufacturing the electronic device according to an embodiment of the present invention.

The method for manufacturing an electronic device includes spraying raw materials of the metal oxide film onto the silicone-containing layer to form the metal oxide film, and may further include other processes as necessary.

Examples of the raw materials include metal oxide particles having p-type semiconductivity (to be described later).

Specific examples of the method of spraying raw materials of the metal oxide film include an aerosol deposition method ("AD method").

Metal Oxide Particles having p-type Semiconductivity

Metal oxide particles of the present disclosure that are used as raw material particles for forming the metal oxide film by spraying the metal oxide particles are not particularly limited and can be suitably selected to suit to a particular application as long as they have p-type semiconductivity. Preferred examples thereof include delafossite-type oxides. The volume-based particle size distribution thereof has two local maximum values, i.e., a first local maximum value (in a range of 0.1 μm or more and less than 5 μm) and a second local maximum value (in a range of 5 μm or more and less than 50 μm), and the ratio of the second local maximum value to the first local maximum value is 0.5 or more and less than 2.0. In addition, 99% by volume or more of the particles have a particle diameter in a range of from 0.1 to 50 μm.

When the first local maximum value is less than 0.1 the particles are easy to aggregate and difficult to become aerosol. When it is 5 μm or more, it is difficult to densify the film. When the second local maximum value is less than 5 the adhesion between the substrate surface and the metal oxide film is poor, so that the film is easily peeled off. When it is 50 or more, the substrate surface or the metal oxide film formed on the substrate surface gets blasted, so that the metal oxide film cannot be formed.

When the ratio of the second local maximum value to the first local maximum value is less than 0.5, the film is easily peeled off due to poor adhesion between the substrate surface and the metal oxide film. When the ratio is 2.0 or more, it is difficult to densify the film.

The metal oxide particles of the present disclosure having p-type semiconductivity and the specific particle size distribution can be obtained by processing a metal oxide, produced by any method, using a conventional pulverizer such as planetary mill, dry bead mill, and jet mill.

The particle diameter of the metal oxide particles is measured using MICROTRAC MT3300EXII (product of MicrotracBEL Corp.) at an air pressure of 0.2 MPa and a measurement time of 10 seconds.

It is desirable that the metal oxide particles having p-type semiconductivity comprise the above-described delafossite-type oxide.

Aerosol Deposition (AD) Method

The aerosol deposition (AD) method is a technique for forming a film by mixing pre-prepared fine particles or ultrafine particles with a gas to form an aerosol and injecting the aerosol to a film-forming target (substrate) through a nozzle.

The AD method enables formation of a film in a normal temperature environment while maintaining the crystal structures of raw materials, which is suitable for forming a film on a device (particularly an electrophotographic photoconductor).

One method for forming a metal oxide film by the aerosol deposition method is described below.

In this method, an aerosol deposition device illustrated in FIG. 1 is used. A gas cylinder 110 illustrated in FIG. 1 stores an inert gas for generating an aerosol. The gas cylinder 110 is connected to an aerosol generator 130 via a pipe 120a. The pipe 120a is drawn out into the aerosol generator 130. The aerosol generator 130 is charged with a certain amount of particles 200 comprising a metal oxide or compound semiconductor. Another pipe 120b connected to the aerosol generator 130 is connected to an injection nozzle 150 inside a film formation chamber 140.

Metal oxide particles having p-type semiconductivity, as the particles 200, may be put in the aerosol generator 130, to generate an aerosol, that is connected to the injection nozzle 150 through the pipe 120b.

Inside the film formation chamber 140, a substrate holder 170 holds a substrate 160 so as to face the injection nozzle 150. Specific examples of the substrate 160 include, but are not limited to, a device such as a cylindrical conductive substrate, a photoconductor, a solar cell, and an EL device. An exhaust pump 180 is connected to the film formation chamber 140 via a pipe 120c for adjusting the degree of vacuum in the film formation chamber 140.

This film formation device of the present embodiment for forming an electrode includes a mechanism for moving the injection nozzle 150 in the lateral direction at a constant speed while rotating the substrate holder 170 with a rotator 170a. Since film formation is performed while the injection nozzle 150 is moved in the lateral direction, a metal oxide film having a desired area can be formed on the substrate 160.

In the process of forming the metal oxide film, first, a pneumatic valve 190 is closed, and the exhaust pump 180 evacuates the film formation chamber 140 and the aerosol generator 130. Next, the pneumatic valve 190 is opened to introduce the gas in the gas cylinder 110 into the aerosol generator 130 through the pipe 120a and sprinkle the particles 200 inside the container, thereby generating an aerosol in which the particles 200 are dispersed in the gas. The generated aerosol is injected at a high speed from the injection nozzle 150 toward the substrate 160 through the pipe 120b. After 0.5 seconds have elapsed with the pneumatic valve 190 opened, the pneumatic valve 190 is closed for the next 0.5 seconds. After that, the pneumatic valve 190 is opened again, and the pneumatic valve 190 is repeatedly opened and closed at a cycle of 0.5 seconds. The flow rate of gas from the gas cylinder 110 is 2 liter/minute, the film formation time is 1 hour, the degree of vacuum in the film formation chamber 140 when the pneumatic valve 190 is closed is about 10 Pa, and the degree of vacuum in the film formation chamber 140 when the pneumatic valve 190 is opened is about 100 Pa.

The injection speed of the aerosol can be controlled by the shape of the injection nozzle 150, the length and inner diameter of the pipe 120b, the gas internal pressure of the gas cylinder 110, the exhaust amount of the exhaust pump 180 (internal pressure of the film formation chamber 140), or the like. For example, when the internal pressure of the aerosol generator 130 is several tens of thousands of Pa, the internal pressure of the film formation chamber 140 is several hundred Pa, and the shape of the opening of the injection nozzle 150 is a circular shape with an inner diameter of 1 mm, the injection speed of the aerosol can be set to several hundred m/sec due to the difference in internal pressure between the aerosol generator 130 and the film formation chamber 140. When the internal pressure of the film formation chamber 140 is maintained at from 5 to 100 Pa and the internal pressure of the aerosol generator 130 is maintained at 50,000 Pa, a metal oxide film having a pore ratio of from 5% to 30% can be formed. It is preferable to adjust the average thickness of the metal oxide film to from 0.1 to 10 μm by adjusting the time for supplying the aerosol under this condition.

The average thickness of the metal oxide film can be set to an appropriate thickness for each device.

In the case of an electrophotographic photoconductor, which is one of the devices, a preferred average thickness of the metal oxide film is from 1.2 to 1.8 μm for achieving the best mode in device durability and print image quality.

The particles 200 in the aerosol that have been accelerated and gained kinetic energy are allowed to collide with the substrate 160 and finely crushed by impact energy. As the crushed particles get joined to the substrate 160, or the crushed particles get joined to each other, a metal oxide film is sequentially formed on the charge transport layer.

Film formation is performed by a plurality of line patterns and rotation of the photoconductor drum. A metal oxide film having a desired area is formed while scanning the substrate holder 170 and the injection nozzle 150 in the longitudinal and lateral directions on the surface of the substrate 160.

Embodiments of the device of the present disclosure are listed below.

1: Electrophotographic Photoconductor and Electrophotographic Apparatus

One embodiment of the electronic device of the present disclosure is an electrophotographic photoconductor.

The electrophotographic photoconductor (hereinafter may be referred to as simply "photoconductor") includes a conductive substrate as a support, a charge transport layer containing a charge transport material overlying the conductive substrate, a silicone-containing layer overlying the charge transport layer, and a metal oxide film overlying the silicone-containing layer, and may further include other layers such as a charge generation layer, an intermediate layer, and a protective layer as necessary.

The above-described matter may be appropriately applied to the silicone-containing layer of the present embodiment.

The above-described matter may be appropriately applied to the metal oxide film of the present embodiment.

A layer in which a charge generation layer and a charge transport layer are sequentially laminated may be referred to as a photosensitive layer.

Hereinafter, a case in which the device is an electrophotographic photoconductor is described in detail, but embodiments of the present invention are not limited to the electrophotographic photoconductor and include other devices.

Figure 2:
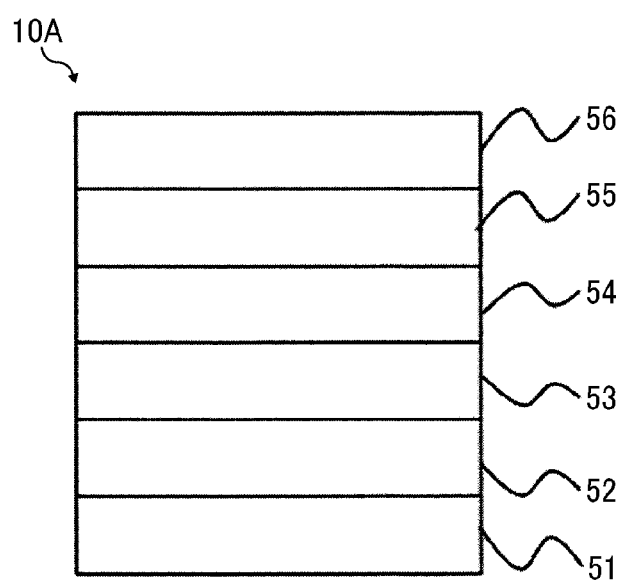
FIG. 2 is a cross-sectional view of a device (electrophotographic photoconductor) according to an embodiment of the present invention.

The configuration of a device 10A (hereinafter also referred to as "electrophotographic photoconductor 10A") is described below with reference to FIG. 2. FIG. 2 is a cross-sectional view of the electrophotographic photoconductor 10A. Referring to FIG. 2, the electrophotographic photoconductor 10A include, from the innermost side thereof, a conductive substrate 51, an intermediate layer 52, a charge generation layer 53, a charge transport layer 54, a silicone-containing layer 55, and a metal oxide film 56. The intermediate layer 52 can be removed as appropriate.

Support (Conductive Substrate)

The conductive substrate is not particularly limited and can be suitably selected to suit to a particular application as long as it has a volume resistivity of $10^{10}$ Ω·cm or less. For example, plastic films, plastic cylinders, and paper sheets may be used which are coated with a metal (e.g., aluminum, nickel, chromium, nichrome, copper, silver, gold, platinum, iron) or a metal oxide (e.g., tin oxide, indium oxide) by vapor deposition or sputtering. In addition, tubes made from plates of aluminum, aluminum alloy, nickel, or stainless steel by means of drawing ironing, impact ironing, extruded ironing, extruded drawing, or cutting, followed by surface treatment such as cutting, super finishing, and polishing, may also be used.

Intermediate Layer

The electrophotographic photoconductor may have an intermediate layer between the conductive substrate and the photosensitive layer. The intermediate layer is provided for improving adhesion, preventing moire, improving coatability of the upper layer, and preventing charge injection from the conductive substrate.

The intermediate layer generally contains a resin as a main component. Since the photosensitive layer is generally applied onto the intermediate layer, a thermosetting resin which is poorly soluble in an organic solvent is suitable for the resin of the intermediate layer. In particular, polyurethane, melamine resin, and alkyd-melamine resin are preferred, because most of them meet this object.

Specific examples of the organic solvent include, but are not limited to, tetrahydrofuran, cyclohexanone, dioxane, dichloroethane, and butanone. The resin appropriately diluted with the organic solvent can be used as a coating material.

Furthermore, fine particles of a metal or metal oxide may be contained in the intermediate layer to adjust conductivity or to prevent moire. Preferred examples of the metal oxide include titanium oxide and zinc oxide. The fine particles may be dispersed in the organic solvent by a ball mill, an attritor, a sand mill, or the like. The resulted dispersion liquid may be mixed with the resin component to prepare a coating material.

A film formation method for preparing the intermediate layer may include the processes of coating the conductive substrate with the coating material by dip coating, spray coating, bead coating, or the like, and optionally heating the resulted film for curing as needed. In many cases, an appropriate average thickness of the intermediate layer is about 2 to 20 μm. When accumulation of residual potential in the photoconductor is large, it is preferably less than 3 μm.

Photosensitive Layer

The photosensitive layer of the electrophotographic photoconductor is a laminated photosensitive layer in which the charge generation layer and the charge transport layer are laminated.

Charge Generation Layer

The charge generation layer refers to a part of the laminated photosensitive layer and has a function of generating charge upon exposure to light. The charge generation layer contains a charge generation material as a main component, and may further contain a binder resin as necessary. Examples of the charge generation material include inorganic charge generation materials and organic charge generation materials.

Specific examples of the inorganic charge generation materials include, but are not limited to, crystalline selenium, amorphous selenium, selenium-tellurium, selenium-tellurium-halogen, selenium-arsenic compounds, and amorphous silicon. Preferred examples of the amorphous silicon include those obtained by terminating dangling bonds with hydrogen atoms or halogen atoms, and those doped with boron atoms, phosphorus atoms, or the like.

Specific examples of the organic charge generation materials include known materials such as metal phthalocyanines such as titanyl phthalocyanine and chlorogallium phthalocyanine, metal-free phthalocyanines, azulenium salt pigments, squaric acid methine pigments, symmetrical or asymmetrical azo pigments having a carbazole backbone, symmetrical or asymmetrical azo pigments having a triphenylamine backbone, symmetrical or asymmetrical azo pigments having a fluorenone backbone, and perylene pigments. Among them, metal phthalocyanines, symmetrical or asymmetrical azo pigments having a fluorenone backbone, symmetrical or asymmetrical azo pigments having a triphenylamine backbone, and perylene pigments are preferred for their high quantum efficiency in charge generation. Each of these charge generation materials may be used alone or in combination with others.

Specific examples of the binder resin include, but are not limited to, polyamide, polyurethane, epoxy resin, polyketone, polycarbonate, polyarylate, silicone resin, acrylic resin, polyvinyl butyral, polyvinyl formal, polyvinyl ketone, polystyrene, poly-N-vinylcarbazole, and polyacrylamide.

Among these, polyvinyl butyral is often used and is useful. Each of these binder resins may be used alone or in combination with others.

Method for Preparing Charge Generation Layer

The method for preparing the charge generation layer is roughly divided into vacuum thin film preparation and casting of a solution dispersion system.

The vacuum thin film preparation includes vacuum deposition, glow discharge decomposition, ion plating, sputtering, reactive sputtering, and CVD (chemical vapor deposition), and is suitable for preparing a layer containing the above-described inorganic charge generation material or organic charge generation material.

The method for preparing the charge generation layer by casting include the processes of dispersing the above-described inorganic charge generation material or organic charge generation material, together with a binder resin as necessary, in an organic solvent using a ball mill, an attritor, a sand mill, or the like, appropriately diluting the resulted dispersion liquid, and applying the liquid dispersion.

Specific examples of the organic solvent include, but are not limited to, tetrahydrofuran, cyclohexanone, dioxane, dichloroethane, and butanone. Among these, methyl ethyl ketone, tetrahydrofuran, and cyclohexanone are preferred because they have a lower degree of environmental impact as compared with chlorobenzene, dichloromethane, toluene, and xylene.

The application may be performed by, for example, dip coating, spray coating, or bead coating.

The average thickness of the charge generation layer is preferably from 0.01 to 5 µm. Reduction of residual potential and increase of sensitivity are often achieved by thickening the charge generation layer. On the other hand, in many cases, charge properties such as charge retentivity and space charge formation deteriorate. To balance these properties, the average thickness of the charge generation layer is preferably in the range of from 0.05 to 2 µm.

If necessary, the charge generation layer may further contain a low molecular compound such as an antioxidant, a plasticizer, a lubricant, and an ultraviolet absorber, and a leveling agent. Each of these compounds can be used alone or in combination with others. When the low molecular compound and the leveling agent are used in combination, sensitivity deteriorates in many cases. Therefore, the combined amount of the low molecular compound and the leveling agent is preferably from 0.1 to 20 phr, more preferably from 0.1 to 10 phr. In addition, the amount of the leveling agent is preferably from 0.001 to 0.1 phr.

Charge Transport Layer

The charge transport layer refers to a part of the laminated photosensitive layer and has functions of injecting and transporting the charge generated in the charge generation layer and neutralizing the surface charge of the photoconductor provided by charging. The charge transport layer contains a charge transport material and a binder component that binds the charge transport material as main components.

Examples of the charge transport material include electron transport materials and hole transport materials.

Examples of the electron transport materials include, but are not limited to, electron accepting materials such as asymmetrical diphenoquinone derivatives, fluorene derivatives, and naphthalimide derivatives. Each of these electron transport materials may be used alone or in combination with others.

Preferred examples of the hole transport materials include electron donating materials. Specific examples thereof include, but are not limited to, oxazole derivatives, oxadiazole derivatives, imidazole derivatives, triphenylamine derivatives, butadiene derivatives, 9-(p-diethylaminostyryl)anthracene), 1,1-bis-(4-dibenzylaminophenyl)propane, styrylanthracene, styrylpyrazoline, phenylhydrazones, α-phenylstilbene derivatives, thiazole derivatives, triazole derivatives, phenazine derivatives, acridine derivatives, benzofuran derivatives, benzimidazole derivatives, and thiophene derivatives. Each of these hole transport materials may be used alone or in combination with others.

Examples of the binder component include, but are not limited to, thermoplastic or thermosetting resins such as polystyrene, polyester, polyvinyl, polyarylate, polycarbonate, acrylic resin, silicone resin, fluororesin, epoxy resin, melamine resin, urethane resin, phenol resin, and alkyd resin. Among these, polystyrene, polyester, polyarylate, and polycarbonate exhibit good charge transfer property and are useful as the binder component of the charge transport material.

To modify the charge transport layer, the following electrically inactive high molecular compounds can be used: cardo-polymer-type polyester having a bulky backbone such as fluorene; polyester such as polyethylene terephthalate and polyethylene naphthalate; polycarbonate in which the 3 and 3' positions of the phenol components of a bisphenol-type polycarbonate are alkyl-substituted, such as C-type polycarbonate; polycarbonate in which the geminal methyl group of bisphenol A is substituted with a long-chain alkyl group having 2 or more carbon atoms; polycarbonate having a biphenyl or biphenyl ether backbone; polycaprolactone; polycarbonate having a long-chain alkyl backbone such as polycaprolactone; acrylic resin; polystyrene; and hydrogenated butadiene.

Here, the electrically inactive high molecular compound refers to a high molecular compound free of a chemical structure that exhibits photoconductivity such as a triarylamine structure. When such a high molecular compound is used as an additive in combination with a binder resin, the proportion thereof is preferably 50% by mass or less based on the total solid content of the charge transport layer in view of restriction of photosensitivity.

When the charge transport material is used, the content thereof is preferably from 40 to 200 phr, and more preferably from 70 to 100 phr. In addition, a material obtained by copolymerizing 100 parts by mass of a charge transport component with 0 to 200 parts by mass, preferably about 80 to 150 parts by mass, of a resin component is preferably used.

The charge transport layer can be formed by dissolving or dispersing a mixture or copolymer containing a charge transport component and a binder component as main components in a suitable solvent to prepare a charge transport layer coating material, then applying the coating material, followed by drying. The applying method may be, for example, dipping, spray coating, ring coating, roll coating, gravure coating, nozzle coating, or screen printing.

Examples of the dispersion solvent for preparing the charge transport layer coating material include, but are not limited to: ketones such as methyl ethyl ketone, acetone, methyl isobutyl ketone, and cyclohexanone; ethers such as dioxane, tetrahydrofuran, and ethyl cellosolve; aromatics such as toluene and xylene; halogens such as chlorobenzene and dichloromethane; and esters such as ethyl acetate and butyl acetate. Among these, methyl ethyl ketone, tetrahydrofuran, and cyclohexanone are preferred because they have a lower degree of environmental impact as compared with chlorobenzene, dichloromethane, toluene, and xylene. Each of these solvents can be used alone or in combination with others.

A cross-linked surface layer may be laminated on the charge transport layer. In this case, it is unnecessary to design the charge transport layer to be thicker in consideration of wear in practical use. The average thickness of the charge transport layer is preferably from 10 to 40 µm, more preferably from 15 to 30 µm, for securing sensitivity and chargeability required in practical use.

If necessary, the charge transport layer may further contain a low molecular compound such as an antioxidant, a plasticizer, a lubricant, and an ultraviolet absorber, and a leveling agent. Each of these compounds can be used alone or in combination with others. When the low molecular compound and the leveling agent are used in combination, sensitivity deteriorates in many cases. Therefore, the combined amount of the low molecular compound and the leveling agent is about from 0.1 to 20 phr, preferably from 0.1 to 10 phr. In addition, the amount of the leveling agent is preferably from 0.001 to 0.1 phr.

Silicone-Containing Layer

The above-described matter relating to the silicone-containing layer of the device of the present disclosure may be appropriately applied to the silicone-containing layer of the electrophotographic photoconductor.

Metal Oxide Film

The above-described matter relating to the metal oxide film of the device of the present disclosure and the method for producing the same may be appropriately applied to the metal oxide film of the electrophotographic photoconductor and the method for producing the same.

Image Forming Apparatus and Image Forming Method

An image forming apparatus of the present disclosure contains the above-described device. Specific examples of the device include, but are not limited to, the above-described electrophotographic photoconductor.

The image forming apparatus of the present disclosure includes the electrophotographic photoconductor (device), an electrostatic latent image forming device, and a developing device, and optionally other devices as needed.

An image forming method of the present disclosure uses the above-described device. Specific examples of the device include, but are not limited to, the above-described electrophotographic photoconductor.

The image forming method of the present disclosure includes at least an electrostatic latent image forming process and a developing process, and optionally other processes as needed. The image forming method is preferably performed by the image forming apparatus. The electrostatic latent image forming process is preferably performed by the electrostatic latent image forming device. The developing process is preferably performed by the developing device. The other processes are preferably performed by the other devices.

Embodiments of Image Forming Apparatus

Example configurations of the image forming apparatus are described below with reference to the drawings.

Figure 3:
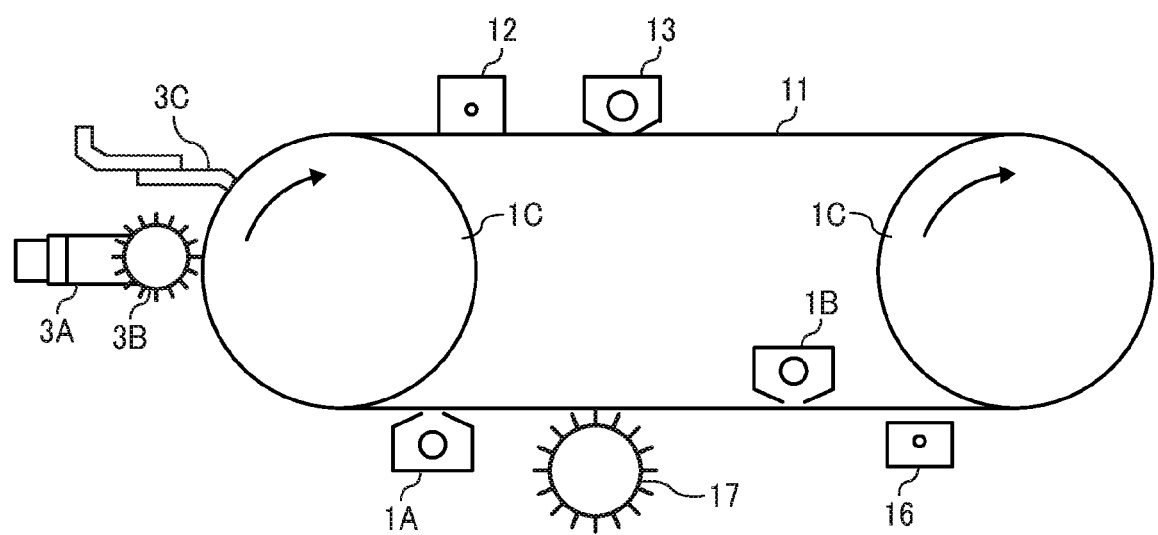
FIG. 3 is a schematic view of an image forming apparatus according to an embodiment of the present invention.

FIG. 3 is a schematic view of an image forming apparatus according to an embodiment of the present invention. A charging device 12 is configured to uniformly charge a surface of an electrophotographic photoconductor 11. Specific examples thereof include known devices such as a corotron, a scorotron, a solid state charger, and a charging roller. The charging device 12 is preferably in contact with or in proximity to the electrophotographic photoconductor 11 for reduction of power consumption. In particular, to prevent contamination of the charging device 12, a charging mechanism is preferably disposed in proximity to the electrophotographic photoconductor 11 forming an appropriate gap between the electrophotographic photoconductor 11 and the surface of the charging device 12. Generally, the above-described charger can also be used for a transfer device 16, but a combination of a transfer charger and a separation charger is more effective therefor.

The electrophotographic photoconductor 11 is driven by drivers 1C and repeatedly subjected to charging by the charging device 12, image exposure by an exposure device 13, image development, transfer by the transfer device 16, pre-cleaning exposure by a pre-cleaning exposure device 1B, cleaning by a cleaning device 17, and electric charge removal by an electric charge removing device 1A. A lubricant 3A, an application brush 3B for applying the lubricant, and an application blade 3C are disposed between the cleaning device 17 and the charging device 12 in the direction of movement of the electrophotographic photoconductor 11.

In FIG. 3, light emission for the pre-cleaning exposure is performed from the substrate side of the electrophotographic photoconductor 11 (in this case, the substrate is translucent).

The above-described electrophotographic process is just an example. Although the pre-cleaning exposure is performed from the substrate side in FIG. 3, this may be performed from the photosensitive layer side. The image exposure and light emission for the electric charge removal may be performed from the substrate side. The image exposure, pre-cleaning exposure, and electric charge removal exposure are illustrated as light emission processes. In addition, the electrophotographic photoconductor may be further subjected to pre-transfer exposure, pre-exposure for image exposure, and other known light emission processes.

Figure 4:
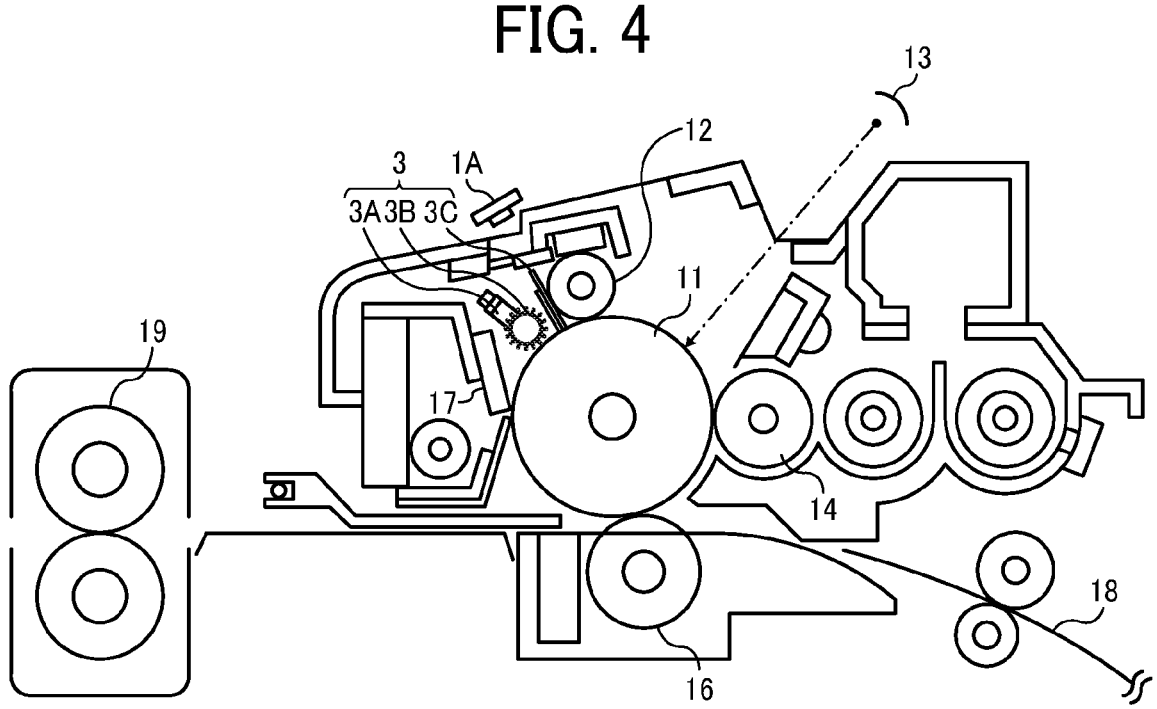
FIG. 4 is a schematic view of an image forming apparatus according to an embodiment of the present invention.

The above-described devices for image formation may be fixedly incorporated in a copier, a facsimile machine, or a printer, and may also be incorporated in such apparatuses in the form of a process cartridge. The process cartridge may be in a variety of shapes. One example thereof is illustrated in FIG. 4. The electrophotographic photoconductor 11 has a drum-like shape, but may also be in a sheet-like shape or an endless-belt-like shape.

The process cartridge includes at least an electrophotographic photoconductor 11 configured to bear an electrostatic latent image, a developing device 14 configured to develop the electrostatic latent image on the electrophotographic photoconductor 11 with toner to form a visible image, and a lubricant supply device 3 (3A, 3B, 3C) configured to supply a lubricant onto the electrophotographic photoconductor 11. The process cartridge may further include other devices such as a charging device 12, an exposure device 13, a transfer device 16, a cleaning device 17, and an electric charge removing device 1A, appropriately selected according to the need. The developing device includes at least a developer container containing a toner or developer, and a developer bearer configured to bear and convey the toner or developer contained in the developer container. The developing device may further include a layer thickness regulator configured to regulate the layer thickness of the toner borne by the developer bearer. The process cartridge is detachably mountable on various electrophotographic image forming apparatuses, facsimile machines, and printers. Particularly preferably, the process cartridge is detachably mounted on the image forming apparatus of the present disclosure.

Figure 5:
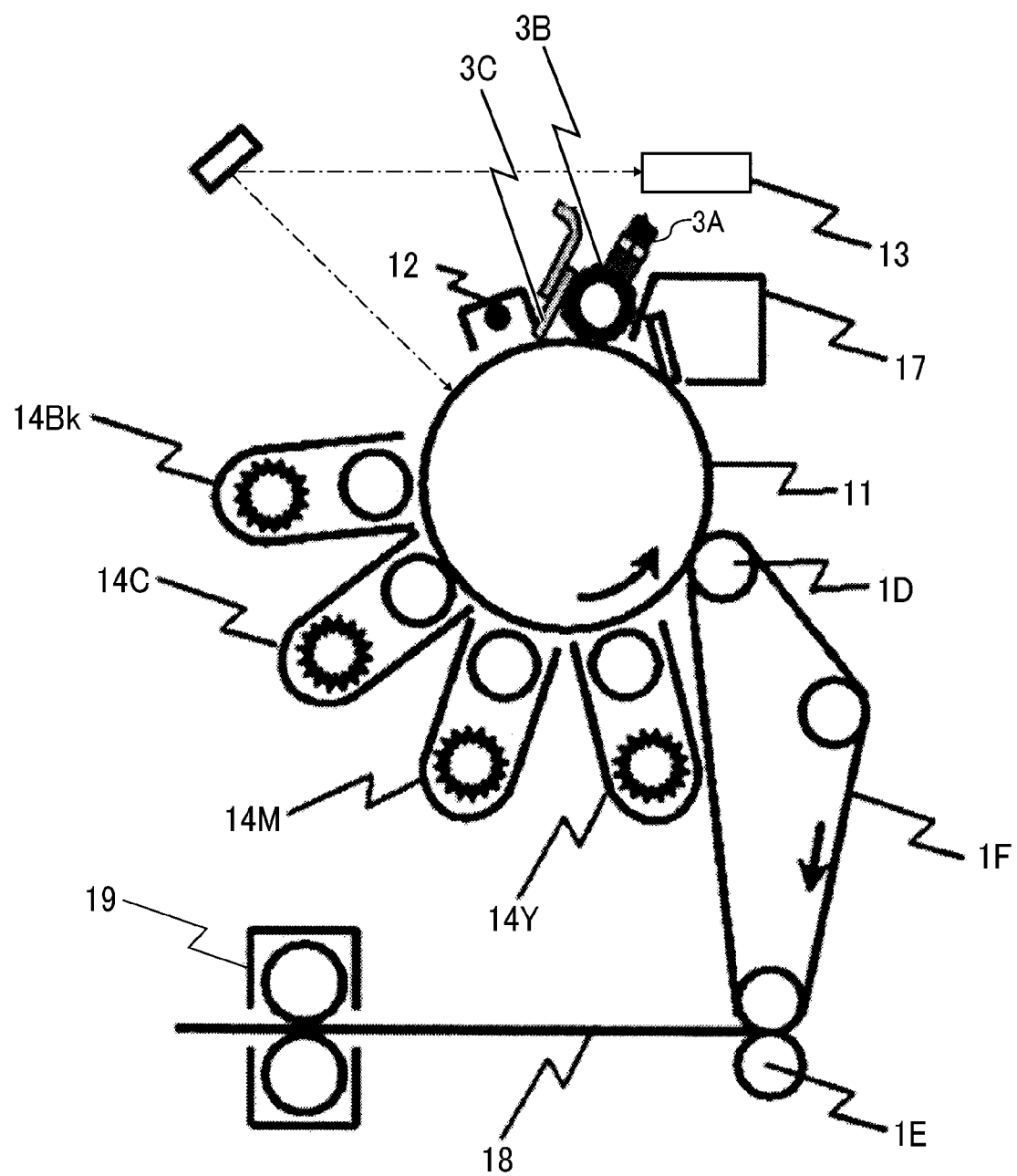
FIG. 5 is a schematic view of an image forming apparatus according to an embodiment of the present invention.

FIG. 5 is a schematic view of an image forming apparatus according to another embodiment of the present invention. In this image forming apparatus, a charging device 12, an exposure device 13, developing devices 14Bk, 14C, 14M, and 14Y for respective colors of black (Bk), cyan (C), magenta (M), and yellow (Y), an intermediate transfer belt 1F as an intermediate transferor, and a cleaning device 17, in this order, are disposed around the electrophotographic photoconductor 11.

The suffixes (Bk, C, M, and Y) in FIG. 5 correspond to the colors of the toners and are appropriately omitted as necessary. The developing devices 14Bk, 14C, 14M, and 14Y can be independently controlled, and only the developing devices of the colors used to form an image are driven. A toner image formed on the electrophotographic photoconductor 11 is transferred onto the intermediate transfer belt 1F by a first transfer device 1D disposed inside the loop of the intermediate transfer belt 1F.

The first transfer device 1D is disposed so as to be capable of either coming into contact with or separating from the electrophotographic photoconductor 11, and brings the intermediate transfer belt 1F into contact with the electrophotographic photoconductor 11 only during the transfer operation. Each color image formation is sequentially performed, then the toner images superimposed on the intermediate transfer belt 1F are collectively transferred onto a print medium 18 by a second transfer device 1E and fixed by a fixing device 19 to form an image. The second transfer device 1E is also disposed so as to be capable of either coming into contact with or separating from the intermediate transfer belt 1F, and comes into contact with the intermediate transfer belt 1F only during the transfer operation.

In an image forming apparatus employing a transfer drum system, color toner images are sequentially transferred onto a print medium that is electrostatically attracted to the transfer drum, which leads to a limitation that thick paper cannot be used as the print medium. On the other hand, in the image forming apparatus employing an intermediate transfer system as illustrated in FIG. 5, color toner images are superimposed on the intermediate transfer belt 1F, so that there is no limitation on the printing medium. Such an intermediate transfer system can be applied not only to the apparatus illustrated in FIG. 5 but also to the above-described image forming apparatuses illustrated in FIGS. 3 and 4 and the below-described image forming apparatuses illustrated in FIGS. 6 and 7. A lubricant 3A, an application brush 3B for applying the lubricant, and an application blade 3C are disposed between the cleaning device 17 and the charging device 12 in the direction of rotation of the electrophotographic photoconductor 11.

Figure 6:
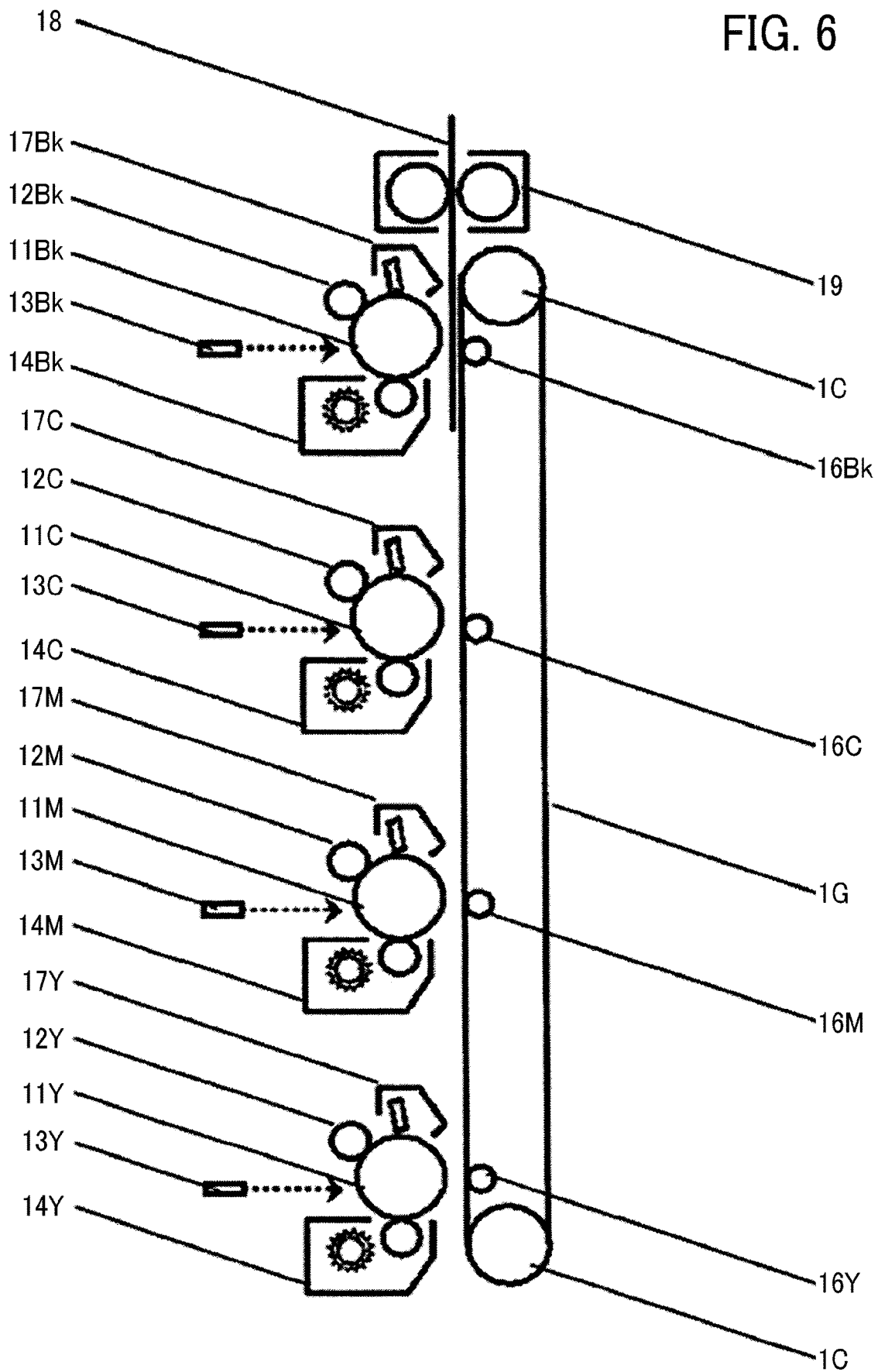
FIG. 6 is a schematic view of an image forming apparatus according to an embodiment of the present invention.

FIG. 6 is a schematic view of an image forming apparatus according to another embodiment of the present invention, which employs a tandem system. This image forming apparatus includes four image forming units containing respective toners of yellow (Y), magenta (M), cyan (C), and black (Bk). The image forming units further include respective electrophotographic photoconductors 11Y, 11M, 11C, and 11Bk. Around the electrophotographic photoconductors 11Y, 11M, 11C, and 11Bk, respective charging devices 12Y, 12M, 12C, and 12Bk, respective exposure devices 13Y, 13M, 13C, and 13Bk, respective developing devices 14Y, 14M, 14C, and 14Bk, and respective cleaning devices 17Y, 17M, 17C, and 17Bk are disposed.

A conveyance transfer belt 1G as a transfer material bearer is capable of either coming into contact with or separating from transfer positions of the electrophotographic photoconductors 11Y, 11M, 11C, and 11Bk arranged in tandem, and is stretched over drivers 1C. Transfer devices 16Y, 16M, 16C, and 16Bk are disposed at the transfer positions facing the respective electrophotographic photoconductors 11Y, 11M, 11C, and 11Bk with the conveyance transfer belt 1G interposed therebetween.

In the image forming apparatus employing a tandem system illustrated in FIG. 6, Y, M, C, and Bk toner images formed on the respective electrophotographic photoconductors 11Y, 11M, 11C, and 11Bk are sequentially transferred onto a print medium 18 held by the conveyance transfer belt 1G. Compared to a full-color image forming apparatus having only one electrophotographic photoconductor, this image forming apparatus is able to output a full color image at a much higher speed. A composite toner image developed on the print medium 18 as a transfer material is conveyed to a fixing device 19 from a position where the electrophotographic photoconductor 11Bk and the transfer device 16Bk face each other, and is fixed on the print medium 18 by the fixing device 19.

Figure 7:
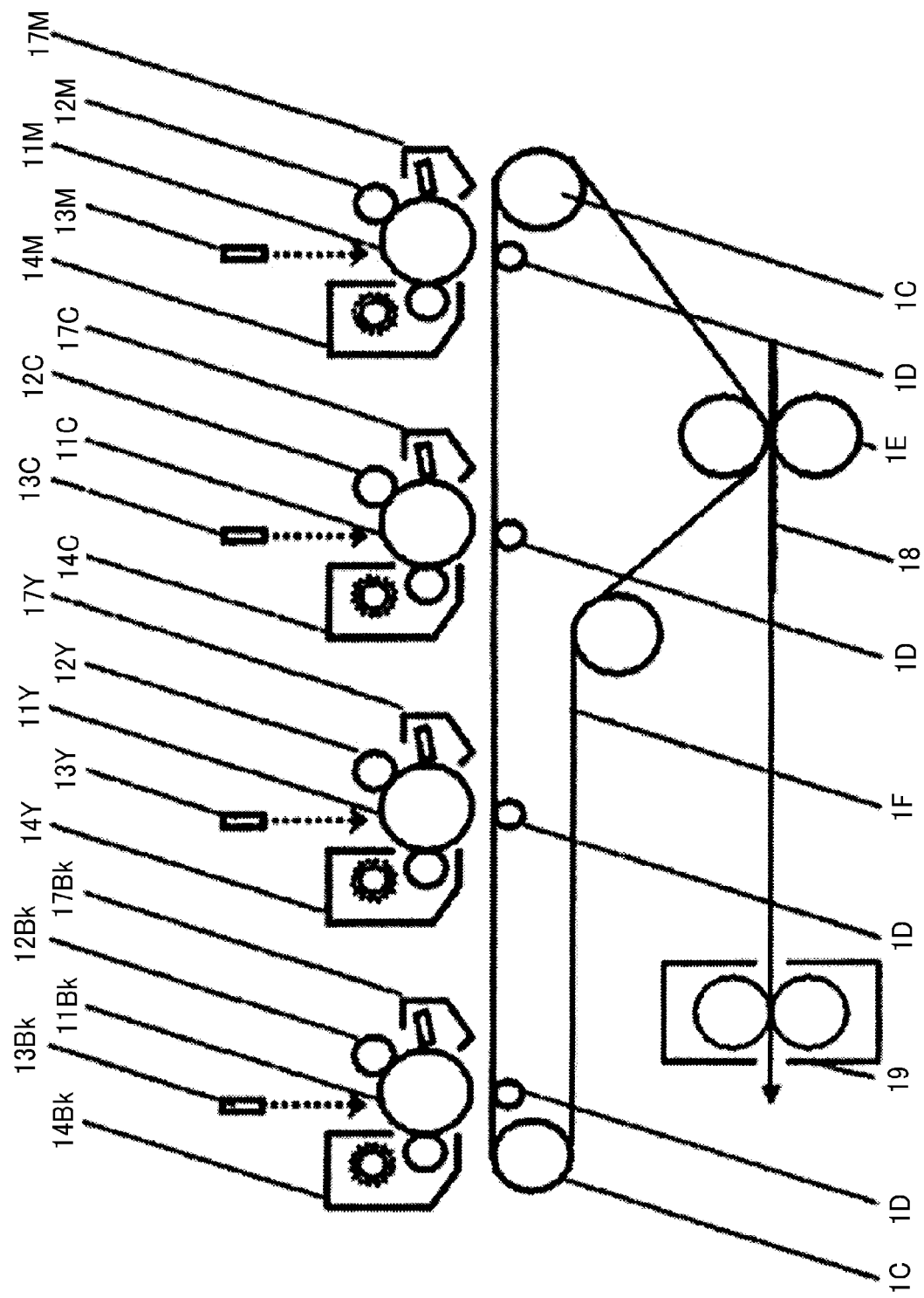
FIG. 7 is a schematic view of an image forming apparatus according to an embodiment of the present invention.

This image forming apparatus may also employ a configuration illustrated in FIG. 7. That is, the direct transfer system using the conveyance transfer belt 1G illustrated in FIG. 6 can be replaced with another system using an intermediate transfer belt 1F illustrated in FIG. 7. In the configuration illustrated in FIG. 7, Y, M, C, and Bk toner images formed on the respective electrophotographic photoconductors 11Y, 11M, 11C, and 11Bk are sequentially transferred and stacked on the intermediate transfer belt 1F stretched over and driven by the drivers 1C by primary transfer devices 1D serving as first transferors to form a full-color image.

Subsequently, the intermediate transfer belt 1F is further driven, and the full-color image held by the intermediate transfer belt 1F is conveyed to a position where a secondary transfer device 1E as a second transferor and a roller disposed opposite to the secondary transfer device 1E face each other. Then, the full-color image is secondarily transferred onto a print medium 18 as a transfer material by the secondary transfer device 1E to form a desired image on the transfer material.

2: Solar Cell

One embodiment of the device of the present disclosure is a solar cell.

The solar cell includes a substrate, a dye-sensitized electrode layer containing a sensitizing dye, a silicone-containing layer overlying the dye-sensitized electrode layer, and a metal oxide film overlying the silicone-containing layer. The solar cell further includes a first electrode, a hole blocking layer, and a second electrode, and optionally other members as necessary.

The above-described matter may be appropriately applied to the silicone-containing layer of the present embodiment.

The above-described matter may be appropriately applied to the metal oxide film of the present embodiment.

Hereinafter, a case in which the device is a solar cell is described in detail, but embodiments of the present invention are not limited to the solar cell and include other devices.

The solar cell according an embodiment of the present invention is described below with reference to the drawings.

The solar cell includes a substrate as a support, a first electrode, a hole blocking layer, an electron transport layer, a dye-sensitized electrode layer, a silicone-containing layer, a ceramic semiconductor film as a metal oxide film, and a second electrode.

Figure 8:
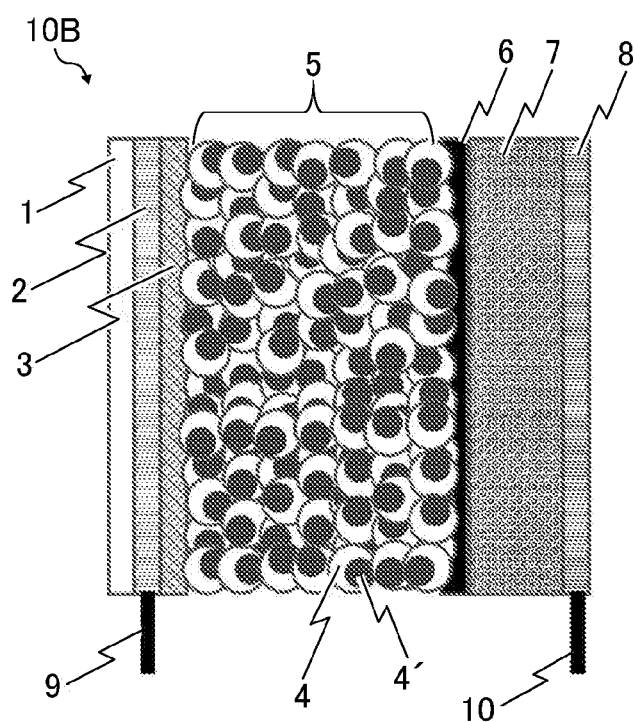
FIG. 8 is a cross-sectional view of a device (solar cell) according to an embodiment of the present invention.

The configuration of a device 10B, which is a solar cell, is described below with reference to FIG. 8. FIG. 8 is a cross-sectional view of a solar cell of the present disclosure.

In the embodiment illustrated in FIG. 8, a first electrode 2 is formed on a substrate 1 as a support, a hole blocking layer 3 is formed on the first electrode 2, and a dye-sensitized electrode layer 5 is formed on the hole blocking layer 3. The dye-sensitized electrode layer 5 comprises an electron transport material 4 adsorbing a photosensitizing material 4'. In the embodiment illustrated in FIG. 8, a silicone-containing layer 6 and a metal oxide film 7 are sandwiched between the dye-sensitized electrode layer 5 and a second electrode 8 that is facing the first electrode 2. In the embodiment illustrated in FIG. 8, lead lines 9 and 10 are disposed to electrically connect the first electrode 2 and the second electrode 8 to each other. The materials of the metal oxide film 7 and the dye-sensitized electrode layer 5 may exude out to one another.

Details are described below.

Support (Substrate)

The substrate 1 as a support is not particularly limited, and known ones can be used.

Preferably, the substrate 1 is made of a transparent material such as a glass plate, a transparent plastic plate, a transparent plastic film, and an inorganic transparent crystalline body.

First Electrode

The first electrode 2 is not particularly limited as long as it is made of a visible-light-transmissive conductive material. Examples thereof include those conventionally used for photoelectric conversion elements and liquid crystal panels.

Specific examples of the material used for the first electrode 2 include, but are not limited to, indium-tin oxide ("ITO"), fluorine-doped tin oxide ("FTO"), antimony-doped tin oxide ("ATO"), indium-zinc oxide, niobium-titanium oxide, and graphene. Each of these may be laminated alone or in combination with others.

The average thickness of the first electrode is preferably from 5 nm to 10 μm, and more preferably from 50 nm to 1 μm.

To maintain a constant level of rigidity, the first electrode is preferably formed on the substrate 1 which is made of a visible-light-transmissive material such as a glass plate, a transparent plastic plate, a transparent plastic film, and an inorganic transparent crystalline body.

Known combined bodies of the first electrode 2 and the substrate 1 may also be used. Examples of such combined bodies include, but are not limited to, FTO-coated glass plates, ITO-coated glass plates, zinc-oxide-and-aluminum-coated glass plates, FTO-coated transparent plastic films, and ITO-coated transparent plastic films.

In addition, a combined body of a substrate (such as glass substrate) with a transparent electrode made of tin oxide or indium oxide doped with a cation or anion having a different atomic valence, or with a metallic electrode having a mesh-like or stripe-like structure to be light transmissive, can also be used.

Each of these materials can be used alone, or mixed with or laminated on the others.

Hole Blocking Layer

The material constituting the hole blocking layer 3 is not particularly limited as long as it is a visible-light-transmissive electron transport material. Preferred examples of such a material include titanium oxide.

The hole blocking layer 3 is provided for suppressing electric power reduction that may be caused when a hole in an electrolyte and an electron on a surface of an electrode are recombined (i.e., reverse electron transfer occurs) as the electrolyte comes into contact with the electrode. The effect of the hole blocking layer 3 is remarkably exerted especially in a solid-state dye-sensitized solar cell.

This is because, compared to a wet-state dye-sensitized solar cell containing an electrolytic solution, in a solid-state dye-sensitized solar cell containing an organic hole transport material, the recombination (reverse electron transfer) speed of a hole in the hole transport material with an electron on the surface of the electrode is greater.

The method for forming the hole blocking layer 3 is not particularly limited but should be carefully considered because the hole blocking layer requires a high internal resistance to suppress current loss under indoor light. Generally, a sol-gel method is used that is one of wet film-forming methods. However, the resulting film cannot sufficiently suppress current loss because the film density is low. Therefore, dry film-forming methods such as sputtering are preferred. The resulting film can suppress current loss because the film density is sufficiently high.

The hole blocking layer 3 has another function of preventing the first electrode 2 and the dye-sensitized electrode layer 5 from electrically contacting with each other. The average thickness of the hole blocking layer is not particularly limited, but is preferably from 5 nm to 1 μm. When the hole blocking layer is formed by a wet film-forming method, the preferred thickness is from 500 to 700 nm. When the hole blocking layer is formed by a dry film-forming method, the preferred thickness is from 10 to 30 nm.

Dye-Sensitized Electrode Layer

The dye-sensitized electrode layer 5 is a layer comprising the electron transport material 4 adsorbing the sensitizing dye (photosensitizing material) 4' on its surface and function as an electrode. The electron transport material 4 adsorbing the sensitizing dye 4' improves conversion efficiency of the solar cell.

In the solar cell, a porous electron transport layer is formed on the hole blocking layer 3. The electron transport layer may be either single-layered or multi-layered.

The electron transport layer is composed of the electron transport material 4. Preferred examples of the electron transport material 4 include semiconductor particles.

In the case of being multi-layered, multiple dispersion liquids containing semiconductor particles of different particle diameters may be applied multiply, or multiple layers of different kinds of semiconductors or different compositions of resins and additives may be applied multiply. In a case in which the average thickness is insufficient as a result of single application, multiple application is effective.

Generally, as the thickness of the dye-sensitized electrode layer increases, the amount of photosensitizing materials carried per unit projected area increases, and therefore the light capture rate increases. However, at the same time, the diffusion distance of injected electrons also increases, thus increasing loss due to recombination of charge. Accordingly, the average thickness of the electron transport layer is preferably in the range of from 100 nm to 100 μm.

The semiconductor is not particularly limited, and known ones can be used. Specific examples thereof include, but are not limited to, single-body semiconductors such as silicon and germanium, compound semiconductors such as metal chalcogenides, and compounds having a perovskite structure.

Specific examples of the metal chalcogenides include, but are not limited to, oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and tellurides of cadmium.

Specific examples of the compound semiconductors include, but are not limited to, phosphides of zinc, gallium, indium, and cadmium; gallium arsenide; copper-indium selenide; and copper-indium sulfide.

Specific examples of the compounds having a perovskite structure include, but are not limited to, strontium titanate, calcium titanate, sodium titanate, barium titanate, and potassium niobate.

Among these materials, oxide semiconductors are preferred, and titanium oxide, zinc oxide, tin oxide, and niobium oxide are more preferred. Each of these materials can be used alone or in combination with others. The semiconductor is not limited in crystal type and may be either single crystalline, polycrystalline, or amorphous.

The average particle diameter of primary particles of the semiconductor particles is not particularly limited but is preferably from 1 to 100 nm, more preferably from 5 to 50 nm. It is possible to improve efficiency by further mixing or stacking other semiconductor particles having a greater average particle diameter to allow incident light to scatter. In this case, the average particle diameter of the semiconductor particles is preferably in the range of from 50 to 500 nm.

The method for preparing the electron transport layer is not particularly limited. Examples thereof include vacuum film-forming methods such as sputtering and wet film-forming methods.

For reducing production cost, wet film-forming methods are preferred. Specifically, a method of applying a paste dispersing a powder or sol of semiconductor particles onto an electron collecting electrode substrate is preferred.

In this wet film-forming method, a method of applying the paste is not particularly limited. For example, the paste may be applied by means of dipping, spraying, wire bar, spin coating, roller coating, blade coating, gravure coating, or wet printing such as relief, offset, gravure, intaglio, rubber plate, and screen printings.

A dispersion liquid of semiconductor particles may be prepared by means of mechanical pulverization or mill, specifically by dispersing at least the semiconductor particles alone or a mixture of the semiconductor particles with a resin in water or an organic solvent. Specific examples of the resin mixed with the semiconductor particles include, but are not limited to, homopolymers and copolymers of vinyl compounds such as styrene, vinyl acetate, acrylate, and methacrylate; and silicone resin, phenoxy resin, polysulfone resin, polyvinyl butyral resin, polyvinyl formal resin, polyester resin, cellulose ester resin, cellulose ether resin, urethane resin, phenol resin, epoxy resin, polycarbonate resin, polyarylate resin, polyamide resin, and polyimide resin.

Specific examples of solvents for dispersing the semiconductor particles include, but are not limited to, water; alcohol solvents such as methanol, ethanol, isopropyl alcohol, and α-terpineol; ketone solvents such as acetone, methyl ethyl ketone, and methyl isobutyl ketone; ester solvents such as ethyl formate, ethyl acetate, n-butyl acetate; ether solvents such as diethyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. Each of these can be used alone or in combination with others.

To prevent reaggregation of particles in the dispersion liquid of semiconductor particles or the paste of semiconductor particles obtained by sol-gel method, etc., an acid (e.g., hydrochloric acid, nitric acid, and acetic acid), a surfactant (e.g., polyoxyethylene(10) octyl phenyl ether), or a chelator (e.g., acetyl acetone, 2-aminoethanol, and ethylenediamine) may be added thereto. For the purpose of improving film-forming performance, adding a thickener is also effective. Specific examples of the thickener include, but are not limited to, polymers such as polyethylene glycol and polyvinyl alcohol, and ethyl cellulose.

It is preferable that semiconductor particles having been applied are brought into electronic contact with each other and exposed to burning, microwave irradiation, electron beam irradiation, or laser light irradiation, for increasing the film strength and adhesion to the substrate. Each of these treatments can be conducted alone or in combination with others.

In the burning, the burning temperature is not particularly limited, but is preferably in the range of from 30° C. to 700° C., more preferably from 100° C. to 600° C., because the resistance of the substrate may become too high or the substrate may melt when the burning temperature is excessively raised. The burning time is not particularly limited, but is preferably from 10 minutes to 10 hours.

In the microwave irradiation, the electron transport layer may be irradiated from either the layer-formed side or the opposite side thereof. The irradiation time is not particularly limited, but is preferably within 1 hour.

After the burning, for the purpose of increasing the surface area of the semiconductor particles as well as increasing the efficiency of electron injection from the photosensitizing material to the semiconductor particles, a chemical plating treatment using an aqueous solution of titanium tetrachloride or a mixed solution thereof with an organic solvent, or an electrochemical plating treatment using an aqueous solution of titanium trichloride may be conducted.

A film in which semiconductor particles having a diameter of several ten nanometers are stacked by sintering, etc., forms a porous structure. Such a nano porous structure has a very large surface area. The surface area can be represented by a roughness factor. The roughness factor is a numerical value indicating the ratio of the actual area of the inside of the porous structure to the surface area of the semiconductor particles applied to the substrate. Accordingly, the higher the roughness factor, the better. In view of the average thickness of the electron transport layer, the roughness factor is preferably 20 or more.

Sensitizing Dye (Photosensitizing Material)

The photosensitizing material 4' as a sensitizing dye is not particularly limited as long as it is photoexcitable by excitation light used. Specific examples thereof include, but are not limited to, phthalocyanine compounds and porphyrin compounds. Among these, metal complex compounds, coumarin compounds, polyene compounds, indoline compounds, and thiophene compounds are preferred.

The photosensitizing material 4' can be adsorbed to the electron transport material 4 by, for example, a method of dipping an electron collecting electrode containing semiconductor particles in a solution or dispersion of the photosensitizing material, or another method of applying the solution or dispersion of the photosensitizing material to the electron transport layer. The former method may be, for example, an immersing method, a dipping method, a roller method, or an air knife method. The latter method may be, for example, a wire bar method, a slide hopper method, an extrusion method, a curtain method, a spin method, or a spray method. Alternatively, the adsorption can be performed in a supercritical fluid of carbon dioxide etc.

At the time of adsorption of the photosensitizing material, a condensation agent can be used in combination.

The condensation agent may act as a catalyst for physically or chemically binding the photosensitizing material and the electron transport material to a surface of an inorganic material, or may stoichiometrically act for advantageously transfer chemical equilibrium. Further, a condensation auxiliary agent, such as a thiol and a hydroxy compound, may be used in combination.

Specific examples of solvents for dissolving or dispersing the photosensitizing material include, but are not limited to, water; alcohol solvents such as methanol, ethanol, and isopropyl alcohol; ketone solvents such as acetone, methyl ethyl ketone, and methyl isobutyl ketone; ester solvents such as ethyl formate, ethyl acetate, and n-butyl acetate; ether solvents such as diethyl ether, dimethoxyethane, tetrahydrofuran, dioxolan, and dioxane; amide solvents such as N,N-dimethylformamide, N,N-dimethylacetamide, and N-methyl-2-pyrrolidone; halogenated hydrocarbon solvents such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon solvents such as n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene. Each of these can be used alone or in combination with others.

Some photosensitizing materials more effectively work when aggregation is suppressed. Therefore, an aggregation dissociating agent can be used in combination. Specific preferred examples of the aggregation dissociating agent include, but are not limited to, steroid compounds such as cholic acid and chenodeoxycholic acid; long-chain alkylcarboxylic acids; and long-chain alkylphosphonic acids. These are appropriately selected depending on the type of the photosensitizing material used. The addition amount of the aggregation dissociating agent is preferably in the range of from 0.01 to 500 parts by mass, more preferably from 0.1 to 100 parts by mass, based on 1 part of the photosensitizing material.

Preferably, the temperature at the adsorption of the photosensitizing material alone or a combination of the photosensitizing material and aggregation dissociating agent is in the range of from −50° C. to 200° C. The adsorption may be performed under either static condition or stirring.

The stirring may be performed by, for example, a stirrer, a ball mill, a paint conditioner, a sand mill, an attritor, a disperser, or an ultrasonic disperser. The time required for the adsorption is preferably from 5 seconds to 1,000 hours, more preferably from 10 seconds to 500 hours, and most preferably from 1 minute to 150 hours. Preferably, the adsorption is performed in dark place.

Silicone-Containing Layer

The above-described matter relating to the silicone-containing layer of the device of the present disclosure and the method for producing the same may be appropriately applied to the silicone-containing layer of the solar cell and the method for producing the same.

Metal Oxide Film

The above-described matter relating to the metal oxide film of the device of the present disclosure and the method for producing the same may be appropriately applied to the metal oxide film 7 of the solar cell and the method for producing the same.

Second Electrode

The second electrode is formed after formation of the metal oxide film. The second electrode may have a similar configuration to the first electrode. However, the substrate is not necessary so long as the strength and sealing performance are sufficiently secured. Specific examples of usable materials for the second electrode include, but are not limited to, metals such as platinum, gold, silver, copper, and aluminum; carbon compounds such as graphite, fullerene, carbon nanotube, and graphene; conductive metal oxides such as ITO, FTO, and ATO; and conductive polymers such as polythiophene and polyaniline.

The average thickness of the second electrode layer is not particularly limited. The second electrode may be formed of either a single material or a mixture of two or more materials. The second electrode can be formed on the dye-sensitized electrode layer by means of, for example, coating, lamination, vapor deposition, CVD (chemical vapor deposition), or bonding, depending on the types of materials used for the second electrode and the hole transport layer.

To act as a photoelectric conversion device (photoelectric conversion element), at least one of the first electrode and the second electrode is substantially transparent.

In the device of the present disclosure, preferably, the first electrode is transparent to allow solar light to enter from the first electrode side. In this case, the second electrode is preferably made of a light reflective material such as metal-deposited or conductive-oxide-deposited glass or plastic, or a metallic thin film.

It is also effective to provide an antireflective layer on the solar light incoming side.

The photoelectric conversion element is applicable to solar cells and power supply devices using the solar cells. The photoelectric conversion element is also applicable to devices using conventional solar cells or power supply device using the solar cells. For example, the photoelectric conversion element can be applied to solar cells used in electronic desk calculators and wristwatches. In particular, the photoelectric conversion element of the present disclosure can be advantageously applied to power supply devices used in mobile phones, electronic organizers, electronic papers, etc. In addition, the photoelectric conversion element can also be used as an auxiliary power supply for lengthening continuous operating time of charge-type or battery-type electronic devices. Furthermore, the photoelectric conversion element can be used as a substitute of a primary battery that is combined with a secondary battery, as a stand-alone power supply for sensors.

3: Organic Electroluminescence Device

Figure 9:
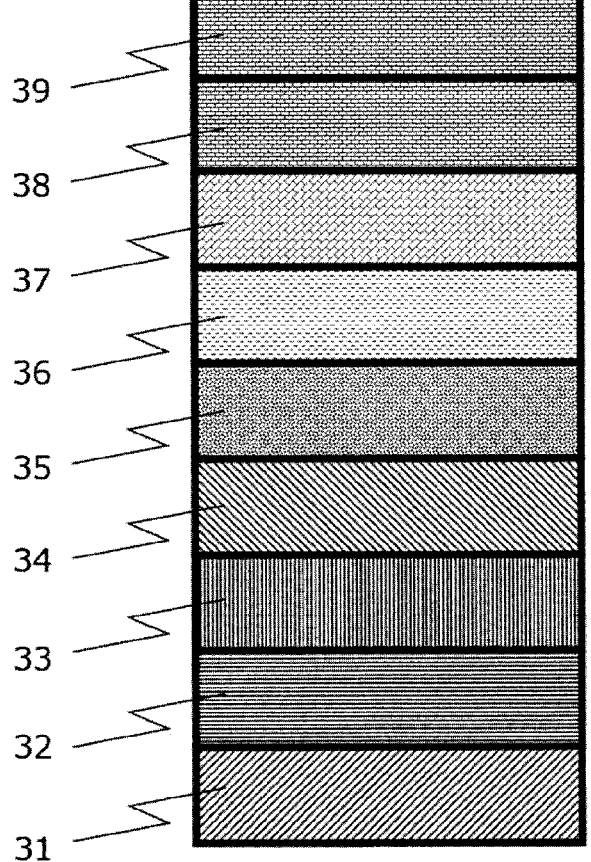
FIG. 9 is a cross-sectional view of a device (organic EL device) according to an embodiment of the present invention.

One embodiment of the device of the present disclosure is an organic electroluminescence (EL) device. FIG. 9 is a cross-sectional view of an organic EL device 10C according to an embodiment of the device of the present disclosure.

In the present disclosure, the reverse layer structure of an organic EL device which is advantageous in durability is regarded as a standard device structure. However, the structure of the organic EL device of the present disclosure is not limited thereto.

The organic EL device includes, from the innermost side thereof, a substrate 31, an anode 32, an electron injection layer 33, an electron transport layer 34, a light emitting layer 35, a hole transport layer 36, a silicone-containing layer 37, a metal oxide film 38, and a cathode 39 to form a laminate structure. Details are described below.

Support (Substrate)

The substrate 31 is not particularly limited, and known ones can be used. Preferably, the substrate 1 is made of a transparent material such as a glass plate, a transparent plastic plate, a transparent plastic film, and an inorganic transparent crystalline body.

Anode

Specific examples of the material of the anode 32 include, but are not limited to, single bodies of elemental metals such as Li, Na, Mg, Ca, Sr, Al, Ag, In, Sn, Zn, and Zr, and alloys thereof. Further, an electrode protective film may be formed on the anode 32 with LiF or the like in the same manner as the anode. Preferred examples of the material further include ITO, IZO, FTO, and aluminum. The average thickness of the anode is preferably from 10 to 500 nm, more preferably from 100 to 200 nm. The thickness can be measured with spectroscopic ellipsometry, surface roughness meter, or microscopic image analysis.

Electron Injection Layer

The electron injection layer 33 can be provided as a layer for lowering the barrier for electron injection from the anode to the electron transport layer that is formed of an organic material having a low electron affinity. Specific examples of the material used for the electron injection layer include, but are not limited to, metal oxides containing magnesium, aluminum, calcium, zirconium, silicon, titanium, and/or zinc, polyphenylene vinylene, hydroxyquinoline, and naphthalimide derivatives.

The average thickness of the electron injection layer is preferably from 5 to 1,000 nm, more preferably from 10 to 30 nm. The average thickness of the electron injection layer can be measured with spectroscopic ellipsometry, surface roughness meter, or microscopic image analysis.

Electron Transport Layer

Specific examples of low molecular weight compounds that can be used as the material of the electron transport layer 34 include, but are not limited to, oxazole derivatives, oxadiazole derivatives, pyridine derivatives, quinoline derivatives, pyrimidine derivatives, pyrazine derivatives, phenanthroline derivatives, triazine derivatives, triazole derivatives, imidazole derivatives, tetracarboxylic anhydrides, various metal complexes such as tris(8-hydroxyquinolinato)aluminum (Alq3), and silole derivatives. Each of these can be used alone or in combination with others.

Among these, metal complexes such as Alq3 and pyridine derivatives are preferred. The average thickness of the electron transport layer is preferably from 10 to 200 nm. More preferably, it is from 40 to 100 nm. The thickness can be measured with spectroscopic ellipsometry, surface roughness meter, or microscopic image analysis.

Light Emitting Layer

Examples of polymer materials forming the light emitting layer 35 include, but are not limited to, polyparaphenylene vinylene compounds, polyfluorene compounds, and polycarbazole compounds.

Examples of low molecular weight materials forming the light emitting layer include, but are not limited to, metal complexes such as tris(8-hydroxyquinolinato)aluminum (Alq3), tris(4-methyl-8-quinolinolate)aluminum(III) (Almq3), 8-hydroxyquinoline zinc (Znq2), (1,10-phenanthroline)-tris-(4,4,4-trifluoro-1-(2-thienyl)-butane-1,3-dionate)europium(III) (Eu(TTA)3(phen)), and 2,3,7,8,12,13,17,18-octaethyl-21H,23H-porphyrin platinum(II); metal complexes such as bis[2-(o-hydroxyphenylbenzothiazole] zinc(II) (ZnBTZ2) and bis[2-(2-hydroxyphenyl)-pyridine] beryllium (Bepp2); metal complexes such as tris[3-methyl-2-phenylpyridine]iridium(III) (Ir(mpy)$_3$); and distyrylbenzene derivatives, phenanthrene derivatives, perylene compounds, carbazole compounds, benzimidazole compounds, benzothiazole compounds, coumarin compounds, perinone compounds, oxadiazole compounds, quinacridone compounds, pyridine compounds, and spiro compounds. Each of these can be used alone or in combination with others.

The average thickness of the light emitting layer is not particularly limited, but is preferably from 10 to 150 nm. More preferably, it is from 20 to 100 nm.

The thickness can be measured with spectroscopic ellipsometry, surface roughness meter, or microscopic image analysis.

Hole Transport Layer

Specific examples of the materials used for the hole transport layer 36 of the organic EL device include, but are not limited to, oxazole derivatives, oxadiazole derivatives, imidazole derivatives, triphenylamine derivatives, butadiene derivatives, 9-(p-diethylaminostyrylanthracene), 1,1-bis-(4-dibenzylaminophenyl)propane, styrylanthracene, styrylpyrazoline, phenylhydrazones, α-phenylstilbene derivatives, thiazole derivatives, triazole derivatives, phenazine derivatives, acridine derivatives, benzofuran derivatives, benzimidazole derivatives, and thiophene derivatives. Specific examples thereof further include polyarylamine, fluorene-arylamine copolymer, fluorene-bithiophene copolymer, poly(N-vinylcarbazole), polyvinylpyrene, polyvinylanthracene, polythiophene, polyalkylthiophene, polyhexylthiophene, poly(p-phenylene vinylene), polythienylene vinylene, pyrene formaldehyde resin, ethylcarbazole formaldehyde resin, and derivatives thereof. Each of these hole transport materials may be used alone, or as a mixture with other hole transport materials or a mixture with other compounds.

The average thickness of the hole transport layer is preferably from 10 to 150 nm, more preferably from 40 to 100 nm.

Silicone-Containing Layer

The above-described matter relating to the silicone-containing layer of the device of the present disclosure and the method for producing the same may be appropriately applied to the silicone-containing layer 37 of the organic EL device and the method for producing the same.

Metal Oxide Film

The above-described matter relating to the metal oxide film of the device of the present disclosure and the method for producing the same may be appropriately applied to the metal oxide film 38 of the organic EL device and the method for producing the same.

Cathode

Preferred examples of the material of the cathode 39 include, but are not limited to, gold, silver, aluminum, and ITO. The thickness can be measured with spectroscopic ellipsometry, surface roughness meter, or microscopic image analysis. When performing vacuum deposition, a crystal oscillator film thickness meter can be used.

EXAMPLES

Hereinafter, the present invention will be further described by way of examples, but the present invention is not limited to the following examples. In the following descriptions, "parts" represents "parts by mass" unless otherwise specified.

Preparation of Copper Aluminum Oxide

A copper aluminum oxide was prepared in the following manner. Cuprous oxide and alumina were weighed to the same molar size, transferred to a mayonnaise bottle, and stirred using a TURBULA MIXER (Type T2C, product of Willy A. Bachofen AG Machinenfabrik) to obtain a mixed powder. The above-obtained mixed powder was heated at 1,100° C. for 40 hours and sieved with a sieve having a pore size of 100

Mixed Powder Materials
  Cuprous oxide (NC-803, product of NC-TECH CO., LTD.): 12 kg
  Alumina (AA-03, product of Sumitomo Chemical Co., Ltd.): 8.58 kg The above-obtained copper aluminum oxide was pulverized using DRYSTAR SDA1 (product of Ashizawa Finetech Ltd.) under arbitrary conditions to prepare copper aluminum oxide particles 1 to 10 of Examples 1-1 to 1-6 and Comparative Examples 1-1 to 1-4, respectively, having different particle size distributions. The particle size distribution of the above-prepared copper aluminum oxide particle 1 is shown in FIG. 10. Table 1 shows the particle diameter and frequency (%) at the first local maximum value, the particle diameter and frequency (%) at the second maximum value, and the ratio of the second local maximum value to the first local maximum value, of the copper aluminum oxide particles.

The copper aluminum oxide particles were vacuum-dried at 100° C. to adjust the moisture content in the copper aluminum oxide particles to 0.2% by mass or less.

The particle diameters of the metal copper aluminum oxide particles were measured using MICROTRAC MT3300EXII (product of MicrotracBEL Corp.) at an air pressure of 0.2 MPa and a measurement time of 10 seconds.

Particle size distribution data was obtained by averaging the results of 5 times of measurements in which different samples were used.

The moisture content of the copper aluminum oxide particles was measured using a moisture meter (CA-200, product of Mitsubishi Chemical Analytech Co., Ltd.).

The composition ratio of elements of each copper aluminum oxide was determined using an X-ray fluorescence analyzer (ZSX Primu IV, product of Rigaku Corporation), and the crystal structure thereof was determined using an X-ray diffractometer (X'Pert PRO, product of Spectris Co., Ltd.).

In Examples 1-1 to 1-6 and Comparative Examples 1-1 to 1-4, 99% by volume or more of the copper aluminum oxide particles were found to have a particle diameter within the range of from 0.1 to 50 μm.

Example 2-1

Production Example of Electrophotographic Photoconductor

An electrophotographic photoconductor of Example 2-1 having, from the innermost side thereof, a conductive substrate, an intermediate layer, a charge generation layer, a charge transport layer, a silicone-containing layer, and a metal oxide film was produced by the following procedure.

Formation of Intermediate Layer

The following intermediate layer coating liquid was applied onto an aluminum conductive substrate (having an outer diameter of 100 mm and a thickness of 1.5 mm) by dip coating to form an intermediate layer. The average thickness of the intermediate layer after drying at 150° C. for 30 minutes was 5 μm.

Intermediate Layer Coating Liquid
  Zinc oxide particles (MZ-300, product of TAYCA Corporation): 350 parts
  3,5-Di-t-butylsalicylic acid (product of Tokyo Chemical Industry Co., Ltd.): 1.5 parts
  Blocked isocyanate (SUMIDUR (registered trademark) 3175, having a solid content concentration of 75%, product of Sumika Bayer Urethane Co., Ltd.): 60 parts
  Solution of 20% by mass of butyral resin in 2-butanone (BM-1, product of SEKISUI CHEMICAL CO., LTD.): 225 parts
  2-Butanone: 365 parts Formation of Charge Generation Layer The following charge generation layer coating liquid was applied onto the above-prepared intermediate layer by dip coating to form a charge generation layer. The average thickness of the charge generation layer was 0.2 μm.

Charge Generation Layer Coating Liquid
  Y-Type titanyl phthalocyanine: 6 parts
  Butyral resin (S-LEC BX-1, product of SEKISUI CHEMICAL CO., LTD.): 4 parts
  2-Butanone (product of Kanto Chemical Co., Inc.): 200 parts

TABLE 1

| | | First Local Maximum Value | | Second Local Maximum Value | | |
|---|---|---|---|---|---|---|
| | | Particle Diameter (μm) | Frequency (%) *a | Particle Diameter (μm) | Frequency (%) *b | Ratio (b/a) |
| Ex. 1-1 | Copper aluminum oxide particles 1 | 1.6 | 3.6 | 8.5 | 2.7 | 0.8 |
| Ex. 1-2 | Copper aluminum oxide particles 2 | 0.2 | 4.2 | 13.5 | 6.5 | 1.6 |
| Ex. 1-3 | Copper aluminum oxide particles 3 | 0.9 | 3.5 | 7.1 | 6.0 | 1.7 |
| Ex. 1-4 | Copper aluminum oxide particles 4 | 1.3 | 2.9 | 5.4 | 5.8 | 2.0 |
| Ex. 1-5 | Copper aluminum oxide particles 5 | 2.3 | 3.3 | 9.6 | 3.7 | 1.1 |
| Ex. 1-6 | Copper aluminum oxide particles 6 | 4.8 | 5.2 | 47.3 | 2.8 | 0.5 |
| Comp. Ex. 1-1 | Copper aluminum oxide particles 7 | 2.1 | 8.1 | 18.7 | 0.8 | 0.1 |
| Comp. Ex. 1-2 | Copper aluminum oxide particles 8 | 3.6 | 1.2 | 37.2 | 11.6 | 9.7 |
| Comp. Ex. 1-3 | Copper aluminum oxide particles 9 | 1.1 | 6.6 | No peak | | Incalculable |
| Comp. Ex. 1-4 | Copper aluminum oxide particles 10 | No peak | | 35.1 | 14.6 | Incalculable |

Formation of Charge Transport Layer

The following charge transport layer coating liquid was applied onto the above-prepared charge generation layer by dip coating to form a charge transport layer.

The average thickness of the charge transport layer after drying at 135° C. for 20 minutes was 22 μm.

Charge Transport Layer Coating Liquid
  Bisphenol-Z-type polycarbonate (PANLITE TS-2050, product of TEIJIN LIMITED): 10 parts
  Low molecular charge transport material having the following structure: 10 parts

[Chem. 8]

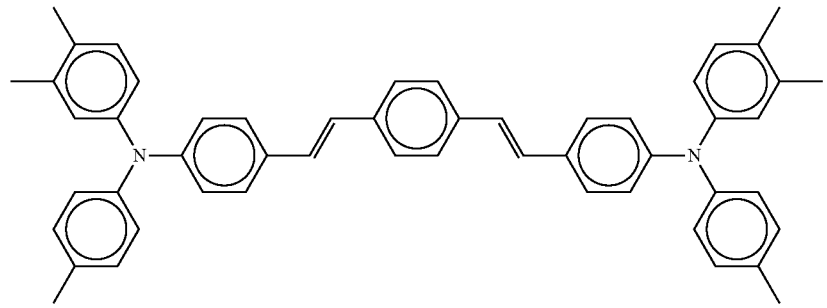

Tetrahydrofuran: 80 parts

Formation of Silicone-Containing Layer

The following silicone-containing layer coating liquid was applied onto the above-prepared charge transport layer by ring coating to form a silicone-containing layer.

The average thickness of the silicone-containing layer after drying at 135° C. for 20 minutes was 0.5 μm.

Silicone-containing Layer Coating Liquid
  Silicon hard coating liquid (NSC-5506, product of NIPPON FINE CHEMICAL CO., LTD.): 187 parts
  Trimethylethoxysilane (product of Tokyo Chemical Industry Co., Ltd.): 24 parts
  Charge transport material having the following structure (made by Ricoh Co., Ltd.): 20 parts

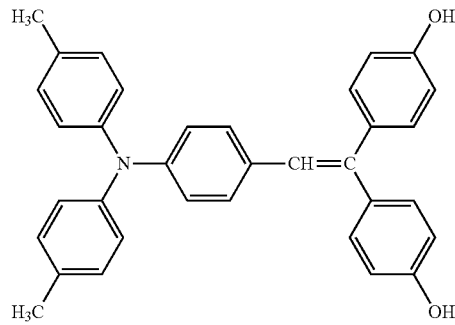 [SMILES: Cc1ccc(N(c2ccc(C)cc2)c2ccc(C=C(c3ccc(O)cc3)c3ccc(O)cc3)cc2)cc1]

Ethanol: 269 parts

Formation of Metal Oxide Film

The film formation chamber used was a modified version of a commercially available vapor deposition apparatus.

The aerosol generator used was a commercially available stirrer (T.K. AGI HOMOMIXER 2M-03, product of PRIMIX Corporation). The aerosol generator may also be a commercially available pumping bottle (RBN-S, product of KATO STAINLESS KAGAKU co., ltd.) having a volume of 1 liter installed in an ultrasonic cleaner (SUS-103, product of Shimadzu Corporation).

A pipe having an inner diameter of 4 mm was drawn from the aerosol generator into the film formation chamber, and an injection nozzle (YB1/8MSSP37, product of Spraying Systems Co. Japan) was attached to the tip of the pipe. The photoconductor was installed at a position 50 mm away from the injection nozzle. A photoconductor holder was provided with a mechanism capable of rotating the photoconductor drum. The injection nozzle used was movable in the lateral direction. The aerosol generator was connected to a gas cylinder filled with nitrogen gas by a pipe having an inner diameter of 4 mm.

A metal oxide film was prepared to have an average thickness of 1.5 μm using the above-described device in the following manner.

The copper aluminum oxide particles 1 were put in the aerosol generator.

Next, an exhaust pump was used to evacuate the film formation chamber and the aerosol generator. Next, nitrogen gas was sent from the gas cylinder into the aerosol generator and stirring was started, thus generating an aerosol in which particles were dispersed in the nitrogen gas. The generated aerosol was injected from the injection nozzle toward the photoconductor through a pipe. At this time, the flow rate of nitrogen gas was from 13 to 20 L/min. The film formation time was 20 minutes, and the degree of vacuum in the film formation chamber at the time of forming the metal oxide film was about 50 to 150 Pa.

Example 2-2

An electrophotographic photoconductor was produced in the same manner as in Example 2-1 except that the copper aluminum oxide particles 1 used for forming the metal oxide film were replaced with copper aluminum oxide particles 2.

Example 2-3

An electrophotographic photoconductor was produced in the same manner as in Example 2-1 except that the copper aluminum oxide particles 1 used for forming the metal oxide film were replaced with copper aluminum oxide particles 3.

Example 2-4

An electrophotographic photoconductor was produced in the same manner as in Example 2-1 except that the copper aluminum oxide particles 1 used for forming the metal oxide film were replaced with copper aluminum oxide particles 4.

Example 2-5

An electrophotographic photoconductor was produced in the same manner as in Example 2-1 except that the copper aluminum oxide particles 1 used for forming the metal oxide film were replaced with copper aluminum oxide particles 5.

Example 2-6

An electrophotographic photoconductor was produced in the same manner as in Example 2-1 except that the copper aluminum oxide particles 1 used for forming the metal oxide film were replaced with copper aluminum oxide particles 6.

Comparative Example 2-1

An electrophotographic photoconductor was produced in the same manner as in Example 2-1 except that the copper aluminum oxide particles 1 used for forming the metal oxide film were replaced with copper aluminum oxide particles 7.

Comparative Example 2-2

An electrophotographic photoconductor was produced in the same manner as in Example 2-1 except that the copper aluminum oxide particles 1 used for forming the metal oxide film were replaced with copper aluminum oxide particles 8.

Comparative Example 2-3

An electrophotographic photoconductor was produced in the same manner as in Example 2-1 except that the copper aluminum oxide particles 1 used for forming the metal oxide film were replaced with copper aluminum oxide particles 9.

Comparative Example 2-4

An electrophotographic photoconductor was produced in the same manner as in Example 2-1 except that the copper aluminum oxide particles 1 used for forming the metal oxide film were replaced with copper aluminum oxide particles 10.

Evaluation of Halftone Image Print Before and After Exposure to $NO_x$

The electrophotographic photoconductor was left to stand in an $NO_x$ atmosphere for a certain period of time to allow $NO_2$ to adsorb to the surface of the photoconductor. The exposure conditions were as follows: the $NO_2$ and NO concentrations in the atmosphere was 40 ppm and 10 ppm, respectively, and the exposure time was 24 hours.

Image evaluation was performed before and after exposure to $NO_x$ using a Ricoh Pro C9110 (product of Ricoh Co., Ltd.) that had been modified to eliminate the initial idling process at the time of image output. Before and after the exposure to $NO_x$, an image pattern was output on 0 sheet, 1,000 sheets, and 10,000 sheets, then an evaluation pattern in which white and black alternated every 2 pixels in the longitudinal and lateral directions at an image resolution of 600 dpi was output. An A3-size copy paper (POD GLOSS COAT, product of Oji Paper Co., Ltd.) was used as the printing sheets, and Pro Toner Black C9100 was used as the toner. The most homogeneous area in the halftone image printed on the sheet was visually selected, and a 4-mm square magnified image (in tiff file format) was acquired using a microscope (MXMACROZ VI, product of Hirox Co., Ltd.).

All halftone dots in this image except for those at the edge of the image were analyzed using an image analysis software program (Image J, developed at National Institutes of Health, USA) to determine each area. Image quality was evaluated based on the coefficient of variation (i.e., value obtained by dividing the standard deviation by the average) of the areas.

Image Evaluation
  A: Coefficient of variation is less than 0.2
  B: Coefficient of variation is 0.2 or more and less than 0.4
  C: Coefficient of variation is 0.4 or more and less than 0.5
  D: Coefficient of variation is 0.5 or more, or halftone dots are not developed The evaluation results of the halftone image print obtained using the electrophotographic photoconductors prepared in Examples 2-1 to 2-6 and Comparative Examples 2-1 to 2-4 were shown in Table 2.

TABLE 2

| | Copper Aluminum Oxide Particles No. | Evaluation of Halftone Image Print (Rank) | | | | | |
|---|---|---|---|---|---|---|---|
| | | Before Exposure to $NO_2$ | | | After Exposure to $NO_2$ | | |
| | | 0 Sheet | 1,000 Sheets | 10,000 Sheets | 0 Sheet | 1,000 Sheets | 10,000 Sheets |
| Ex. 2-1 | 1 | A | A | A | A | A | A |
| Ex. 2-2 | 2 | A | A | A | A | A | B |
| Ex. 2-3 | 3 | A | A | A | A | A | A |
| Ex. 2-4 | 4 | A | A | A | A | A | A |
| Ex. 2-5 | 5 | A | A | B | B | B | B |
| Ex. 2-6 | 6 | A | A | B | B | B | C |
| Comp. Ex. 2-1 | 7 | B | B | D | C | D | D |
| Comp. Ex. 2-2 | 8 | B | C | D | D | D | D |
| Comp. Ex. 2-3 | 9 | B | C | D | D | D | D |
| Comp. Ex. 2-4 | 10 | B | C | D | D | D | D |

Evaluation of Electrophotographic Photoconductor

The electrophotographic photoconductors prepared in Examples 2-1 to 2-6 and Comparative Examples 2-1 to 2-4 were subjected to the following evaluation. The evaluation results for each electrophotographic photoconductor were shown in Table 1.

Conventionally, there has been no problem with the use of the metal oxide particles having p-type semiconductivity of Comparative Examples 2-1 to 2-4 when the purpose is to simply form a metal oxide film. It has been clarified in the present disclosure that, for use in a photoconductor that produces high-definition images for an extended period of time, the metal oxide film should exhibit a high gas barrier property and an excellent charge transport function.

The photoconductors of Examples 2-1 to 2-6 are capable of performing fine photoelectric conversion and developing a halftone image that does not hinder practical use even after exposure to $NO_x$. These are achieved when the volume-based particle size distribution of the metal oxide particles having p-type semiconductivity has two local maximum values, i.e., a first local maximum value (in a range of 0.1 μm or more and less than 5 μm) and a second local maximum value (in a range of 5 μm or more and less than 50 μm), and the ratio of the second local maximum value to the first local maximum value is 0.5 or more and less than 2.0.

Preferred embodiments described and enabled herein include the following (1) to (8):

(1) Metal oxide particles having p-type semiconductivity, wherein the metal oxide particles have a volume-based particle size distribution having a first local maximum value and a second local maximum value,
the first local maximum value is in a range of 0.1 μm or more and less than 5 μm and the second local maximum value is in a range of 5 μm or more and less than 50 μm,
a ratio of the second local maximum value to the first local maximum value is 0.5 or more and less than 2.0, and
99% by volume or more of the metal oxide particles have a particle diameter in a range of from 0.1 to 50 μm.

(2) The metal oxide particles of (1), wherein the metal oxide particles comprise a delafossite-type oxide.

(3) The metal oxide particles of (2), wherein the delafossite-type oxide comprises a copper aluminum oxide.

(4) An electronic device comprising:
a substrate;
a charge transport layer containing a charge transport material or a dye-sensitized electrode layer containing a sensitizing dye, the charge transport layer or the dye-sensitized electrode layer overlying the substrate; and
a metal oxide film containing the metal oxide particles of any one of (1) to (3), the metal oxide film overlying the charge transport layer or the dye-sensitized electrode layer.

(5) The electronic device of (4), further comprising a silicone-containing layer between the charge transport layer or the dye-sensitized electrode layer and the metal oxide film.

(6) A method for manufacturing an electronic device, the method comprising:
forming a charge transport layer containing a charge transport material or a dye-sensitized electrode layer containing a sensitizing dye on a substrate; and
spraying metal oxide particles having p-type semiconductivity onto the charge transport layer or the dye-sensitized electrode layer to form a metal oxide film,
wherein the metal oxide particles have a volume-based particle size distribution having a first local maximum value and a second local maximum value,
the first local maximum value is in a range of 0.1 μm or more and less than 5 μm and the second local maximum value is in a range of 5 μm or more and less than 50 μm,
a ratio of the second local maximum value to the first local maximum value is 0.5 or more and less than 2.0, and
99% by volume or more of the metal oxide particles have a particle diameter in a range of from 0.1 to 50 μm.

(7) The method of (6), wherein the spraying includes an aerosol deposition method that sprays an aerosol of the metal oxide particles.

(8) An image forming apparatus comprising the electronic device of (4) or (5).

The metal oxide particles having p-type semiconductivity according to above (1) to (3), the electronic devices according to above (4) and (5), the method for manufacturing an electronic device according to above (6) and (7), and the image forming apparatus according to above (8) solve the various conventional problems and achieve the object of the present invention.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

This patent application is based on and claims priority to Japanese Patent Application No. 2020-087650, filed on May 19, 2020, in the Japan Patent Office, the entire disclosure of which is hereby incorporated by reference herein.

REFERENCE SIGNS LIST (In FIGS. 1-7 and 9)
1A Electric charge removing device
1B Pre-cleaning exposure device
1C Driver
1D First transfer device, primary transfer device
1E Second transfer device, secondary transfer device
1F Intermediate transferor, intermediate transfer belt
1G Conveyance transfer belt
2 First electrode
3 Lubricant supply device
3A Lubricant
3B Application brush
3C Application blade
10A Electrostatic latent image bearer (Electrophotographic photoconductor)
10B Solar cell
10C Organic electroluminescence device
11, 11Bk, 11C, 11M, 11Y Electrophotographic photoconductor
12, 12Y, 12M, 12C, 12Bk Charging device
13, 13Y, 13M, 13C, 13Bk Exposure device
14, 14Bk, 14C, 14M, 14Y Developing device
15 Toner
16, 16Y, 16M, 16C, 16Bk Transfer device
17, 17Y, 17M, 17C, 17Bk Cleaning device
18 Transfer material, printing media
19 Fixing device
31 Substrate
32 Anode
33 Electron injection layer
34 Electron transport layer
35 Light emitting layer
36 Hole transport layer
37 Silicone-containing layer
38 Metal oxide film
39 Cathode
51 Conductive substrate
52 Intermediate layer 53 Charge generation layer
54 Charge transport layer
55 Silicone-containing layer
56 Metal oxide film
110 Gas cylinder
120a, 120b, 120c Pipe
130 Aerosol generator
140 Film formation chamber
150 Injection nozzle
160 Substrate
170 Substrate holder
170a Rotator
180 Exhaust pump
190 Pneumatic valve
200 Particles
(In FIG. 8)
1 Substrate
2 First electrode
3 Hole blocking layer
4 Electron transport material
4' Photosensitizing material
5 Dye-sensitized electrode layer
6 Silicone-containing layer
7 Metal oxide film
8 Second electrode
9, 10 Lead lines

The invention claimed is:

1. An electronic device, comprising:
a substrate;
a charge transport layer containing a charge transport material or a dye-sensitized electrode layer containing a sensitizing dye, the charge transport layer or the dye-sensitized electrode layer overlying the substrate;
a metal oxide film containing metal oxide particles overlying said charge transport layer or said dye-sensitized electrode layer, comprising a metal oxide having p-type semiconductivity, and
a silicone-containing layer between the charge transport layer or the dye-sensitized electrode layer and the metal oxide film,
wherein the metal oxide particles have a volume-based particle size distribution having a first local maximum value and a second local maximum value,
the first local maximum value is in a range of 0.1 µm or more and less than 5 µm and the second local maximum value is in a range of 5 µm or more and less than 50 µm,
a ratio of the second local maximum value to the first local maximum value is 0.5 or more and less than 2.0, and
99% by volume or more of the metal oxide particles have a particle diameter in a range of from 0.1 to 50 µm.

2. The electronic device of claim 1, wherein the metal oxide comprises a delafossite-type oxide.

3. The electronic device of claim 2, wherein the delafossite-type oxide comprises a copper aluminum oxide.

4. An image forming apparatus comprising an electrophotographic photoconductor comprising the electronic device according to claim 1;
an electrostatic latent image forming device to form an electrostatic latent image on the electrophotographic photoconductor;
a developing device to develop the electrostatic latent image with a toner to form a toner image;
a transfer device to transfer the toner image onto a print medium; and
a fixing device to fix the transferred toner image on the print medium.

5. A method for manufacturing an electronic device, the method comprising:
forming a charge transport layer containing a charge transport material or a dye-sensitized electrode layer containing a sensitizing dye on a substrate; and
spraying metal oxide particles comprising a metal oxide having p-type semiconductivity onto the charge transport layer or the dye-sensitized electrode layer to form a metal oxide film, wherein the spraying includes an aerosol deposition method that sprays an aerosol of the metal oxide particles,
wherein the metal oxide particles have a volume-based particle size distribution having a first local maximum value and a second local maximum value,
the first local maximum value is in a range of 0.1 µm or more and less than 5 µm and the second local maximum value is in a range of 5 µm or more and less than 50 µm,
a ratio of the second local maximum value to the first local maximum value is 0.5 or more and less than 2.0, and
99% by volume or more of the metal oxide particles have a particle diameter in a range of from 0.1 to 50 µm.

* * * * *